(12) United States Patent
Lai et al.

(10) Patent No.: US 12,027,563 B2
(45) Date of Patent: Jul. 2, 2024

(54) IMAGE SENSOR STRUCTURE HAVING FILTER LAYER AND ABSORPTION WAVELENGTH TUNABLE PHOTOELECTRIC LAYER AND MANUFACTURING METHOD THEREOF

(71) Applicant: VisEra Technologies Company Limited, Hsin-Chu (TW)

(72) Inventors: Lai-Hung Lai, Hsinchu (TW); Chin-Chuan Hsieh, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 384 days.

(21) Appl. No.: 17/345,592

(22) Filed: Jun. 11, 2021

(65) Prior Publication Data
US 2022/0399395 A1 Dec. 15, 2022

(51) Int. Cl.
*H01L 27/146* (2006.01)
*H04N 25/75* (2023.01)

(52) U.S. Cl.
CPC .. *H01L 27/14685* (2013.01); *H01L 27/14627* (2013.01); *H04N 25/75* (2023.01)

(58) Field of Classification Search
CPC ......... H01L 27/14685; H01L 27/14627; H01L 27/1462; H01L 27/14625; H01L 27/14669;
(Continued)

(56) References Cited

U.S. PATENT DOCUMENTS

| 9,093,579 B2 * | 7/2015 | Mackey | H01L 27/14621 |
| 10,178,332 B2 * | 1/2019 | Hatano | H01L 27/14645 |

(Continued)

FOREIGN PATENT DOCUMENTS

| EP | 3709361 A1 | 9/2020 |
| JP | 2021-057422 | 4/2021 |

(Continued)

OTHER PUBLICATIONS

European Search Report mailed Apr. 7, 2022 in EP Application No. 21201602.6, 9 pages.
(Continued)

*Primary Examiner* — Kimberly N Rizkallah
*Assistant Examiner* — Pratiksha Jayant Lohakare
(74) *Attorney, Agent, or Firm* — Muncy, Geissler, Olds & Lowe, P.C.

(57) ABSTRACT

The image sensor structure includes a substrate, a readout circuit array, a photoelectric layer and a filter layer. The filter layer has a first spectrum defining a first wavelength. The photoelectric layer has a second spectrum defining a second wavelength. The second wavelength is longer than the first wavelength. The first wavelength corresponds to a first line passing through a first point and a second point on a curve of the first spectrum of the filter layer. The first point aligns with an extinction coefficient of 0.9. The second point aligns with an extinction coefficient of 0.1. The second wavelength corresponds to a second line passing through a third point and a fourth point on a curve of the second spectrum of the photoelectric layer. The third point aligns with an extinction coefficient of 0.9. The fourth point aligns with an extinction coefficient of 0.1.

18 Claims, 19 Drawing Sheets

(58) Field of Classification Search
CPC ......... H01L 27/14621; H01L 27/14665; H01L 27/14636; H04N 25/75; G02B 5/22
USPC ....................................................... 257/432
See application file for complete search history.

(56) References Cited

U.S. PATENT DOCUMENTS

| | | | |
|---|---|---|---|
| 10,861,893 B2* | 12/2020 | Maruyama | H01L 27/14685 |
| 11,545,515 B2* | 1/2023 | Leem | H01L 27/14652 |
| 2010/0060756 A1 | 3/2010 | Inuiya | |
| 2010/0230578 A1* | 9/2010 | Horikoshi | H01L 27/14629 |
| | | | 257/E31.127 |
| 2011/0272772 A1 | 11/2011 | Kokubun | |
| 2013/0134536 A1* | 5/2013 | Mori | H01L 27/1464 |
| | | | 438/70 |
| 2016/0293873 A1* | 10/2016 | Yamaguchi | H01L 27/14687 |
| 2017/0243912 A1* | 8/2017 | Kaneda | H01L 27/14647 |
| 2018/0040656 A1* | 2/2018 | Jang | H01L 27/1464 |
| 2021/0126035 A1* | 4/2021 | Roh | G02B 5/1876 |

FOREIGN PATENT DOCUMENTS

| | | |
|---|---|---|
| WO | WO2019/081416 A1 | 5/2019 |
| WO | WO2020/105360 A1 | 5/2020 |

OTHER PUBLICATIONS

Office Action mailed Jan. 17, 2023 in corresponding Application KR 10-2021-01099848, with English translation, 9 pages.

\* cited by examiner

IMAGE SENSOR STRUCTURE HAVING FILTER LAYER AND ABSORPTION WAVELENGTH TUNABLE PHOTOELECTRIC LAYER AND MANUFACTURING METHOD THEREOF

BACKGROUND

Field of the Invention

The present disclosure relates to an image sensor structure and a manufacturing method thereof, and, in particular, to an image sensor structure having a filter layer and an absorption wavelength tunable-photoelectric layer and a manufacturing method thereof.

Description of the Related Art

Infrared (IR) image sensor is commonly used technology for face recognition and 3D sensing. These IR image sensors detect the signals incoming from laser light source. The commonly used laser wavelength are 850, 940, 980, 1310, 1350, and 1550 nm. The ambient broadband light source is regarded as a noise. To improve the signal to noise ratio (S/N), the narrow band image sensor sensing signals corresponding to the laser wavelength is preferred.

Currently, an ordinary silicon (Si)-based imager is commonly used for 940 nm wavelength, while suffering low quantum efficiency due to relatively weak absorption efficiency in the near-Infrared (NIR) region, which is at a wavelength between about 900 nm to about 1100 nm. In order to enhance the absorption efficiency of the Si-based image sensor in the NIR region, an ultra-deep (>5 um) Si-based photodiode should be used, incurring a higher fabrication cost, a high optical cross talk between pixels, a limited miniaturization, and a lower image density. In addition, Si has no sensitivity above 1100 nm, limiting its application in SWIR region, which is at a wavelength between about 1100 nm to about 1700 nm.

Besides, an ordinary complementary metal oxide semiconductor (CMOS) image sensor integrated with an interference-type narrow band pass filter together as a narrowband IR image sensor will suffer from high-angle dependent peak shift, resulting in a limited field of view (FOV) application. Furthermore, the fabrication complexity, the film thickness, and the cost of the interference-type narrow band pass filter limit the prospects of integrating the image sensor with other features.

Although ordinary image sensor structures have generally met the requirements for their intended uses, these ordinary image sensor structures have not been fully satisfactory in all respects (e.g., the applicable range of the wavelength to be improved). Thus, there are still some problems to be solved regarding image sensor structures for which better performance is sought, as well as the methods of manufacturing said structures.

BRIEF SUMMARY

In view of the above problems, some embodiments of the disclosure include a filter layer with a first spectrum defining a first wavelength and an wavelength tunable-photoelectric layer with a second spectrum defining a second wavelength (which is longer than the first wavelength), in order to expand the sensing wavelength of the narrow band infrared (IR) image sensor and to improve the reliability of the narrow band infrared image sensor.

According to some embodiments, an image sensor structure is provided. The image sensor structure includes a substrate, a readout circuit array, a photoelectric layer and a filter layer. The readout circuit array is located on the substrate. The photoelectric layer is disposed over the readout circuit array. The filter layer is disposed over the photoelectric layer. The filter layer has a first spectrum defining a first wavelength. The photoelectric layer has a second spectrum defining a second wavelength longer than the first wavelength. The first wavelength corresponds to a first line passing through a first point and a second point on a curve of the first spectrum of the filter layer. The first point aligns with an extinction coefficient of 0.9. The second point aligns with an extinction coefficient of 0.1. The second wavelength corresponds to a second line passing through a third point and a fourth point on a curve of the second spectrum of the photoelectric layer. The third point aligns with an extinction coefficient of 0.9. The fourth point aligns with an extinction coefficient of 0.1.

According to some embodiments, a method of manufacturing an image sensor structure is provided. The method of manufacturing the image sensor structure includes forming a substrate; forming a readout circuit array on the substrate; forming a photoelectric layer on the readout circuit array; and forming filter layer over the photoelectric layer. The filter lazes has a first spectrum defining a first wavelength. The photoelectric layer has a second spectrum defining a second wavelength longer than the first wavelength. The first wavelength corresponds to a first line passing through a first point and a second point on a curve of the first spectrum of the filter layer. The first point aligns with an extinction coefficient of 0.9. The second point aligns with an extinction coefficient of 0.1. The second wavelength corresponds to a second line passing through a third point and a fourth point on a curve of the second spectrum of the photoelectric layer. The third point aligns with an extinction coefficient of 0.9. The fourth point aligns with an extinction coefficient of 0.1.

According to some embodiments of the disclosure, the image sensor structures may be used in various types of devices and applications. In order to make the features and advantages of some embodiments more easily understood, some embodiments are listed below in conjunction with the accompanying drawings, and are described in detail as follows.

BRIEF DESCRIPTION OF THE DRAWINGS

Through the following detailed description and the accompanying drawings, a person of ordinary skill in the art will better understand the viewpoints of some embodiments of the disclosure. It is noted that, in accordance with standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
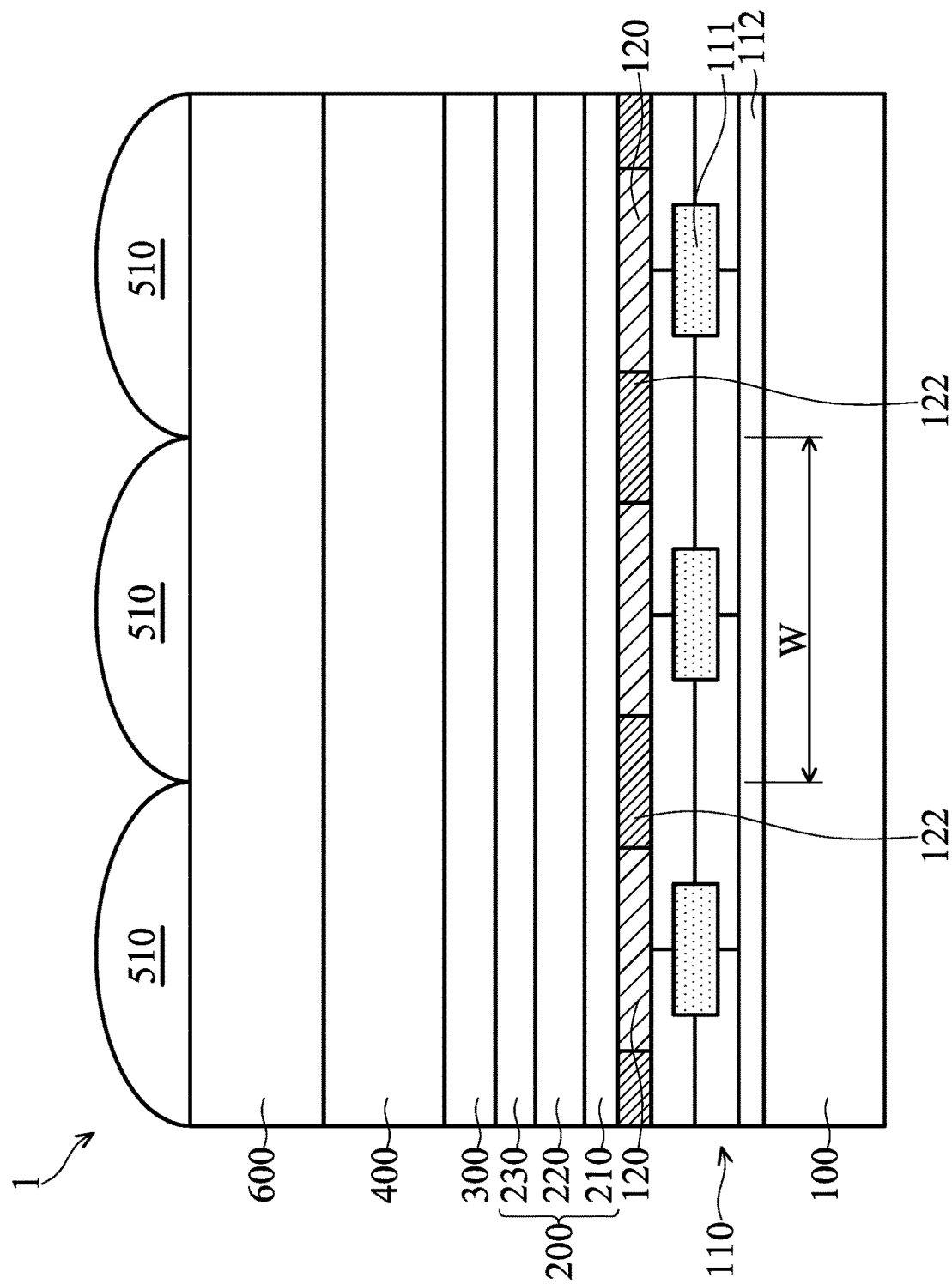
FIGS. 1A-1C are schematic cross-sectional views of an image sensor structure, according to some embodiments of the disclosure.

The following disclosure provides many different embodiments or examples for implementing different features of the image sensor structure disclosed herein. Specific examples of each feature and its configuration are described below to simplify the embodiments of the disclosure. Naturally, these are only examples and are not intended to limit the disclosure. For example, if the description mentions that the first feature is formed on the second element, it may refer to an embodiment in which the first feature and second feature are in direct contact, or it may refer to an embodiment in which additional features are formed between the first feature and the second feature, and wherein the first feature and the second feature are not in direct contact. In addition, some embodiments of the disclosure may repeat reference numerals and/or letters in different examples. Such repetition is for conciseness and clarity, and is not used to indicate a relationship between the different embodiments and/or aspects discussed herein.

Some modifications of the embodiment are described below. In the different accompanying drawings and illustrated embodiments, reference numerals that are similar or the same are used to identify features that are similar or the same. It is understood that additional operations and/or processes may be provided before, during, and after the method disclosed herein, and some of the described operations in some embodiments may be deleted or replaced with other embodiments of the method.

Furthermore, spatially relative terms, for example, "on", "over", "upper", "lower", "above", "below" or the like are used for ease of the disclosure of one features relationship to another feature. The spatially relative terms are intended to encompass different orientations of the feature in use or operation, in addition to the orientation depicted in the accompany drawings. The features may be otherwise oriented (e.g., rotated 90 degrees or other orientations) and the spatially relative terms used herein is interpreted accordingly.

Hereinafter, the terms "about", "approximately", and "substantially" usually mean within ±20% of a given value or a given range, for example, within 4-10%, within 5%, or within 3%, within 2%, within 1%, or within 0.5%. It is noted that, the value provided in the specification is an approximate value, that is, without specific description of "about", "approximately", and "substantially", the meanings of the terms may still be implied.

Figure 1B:
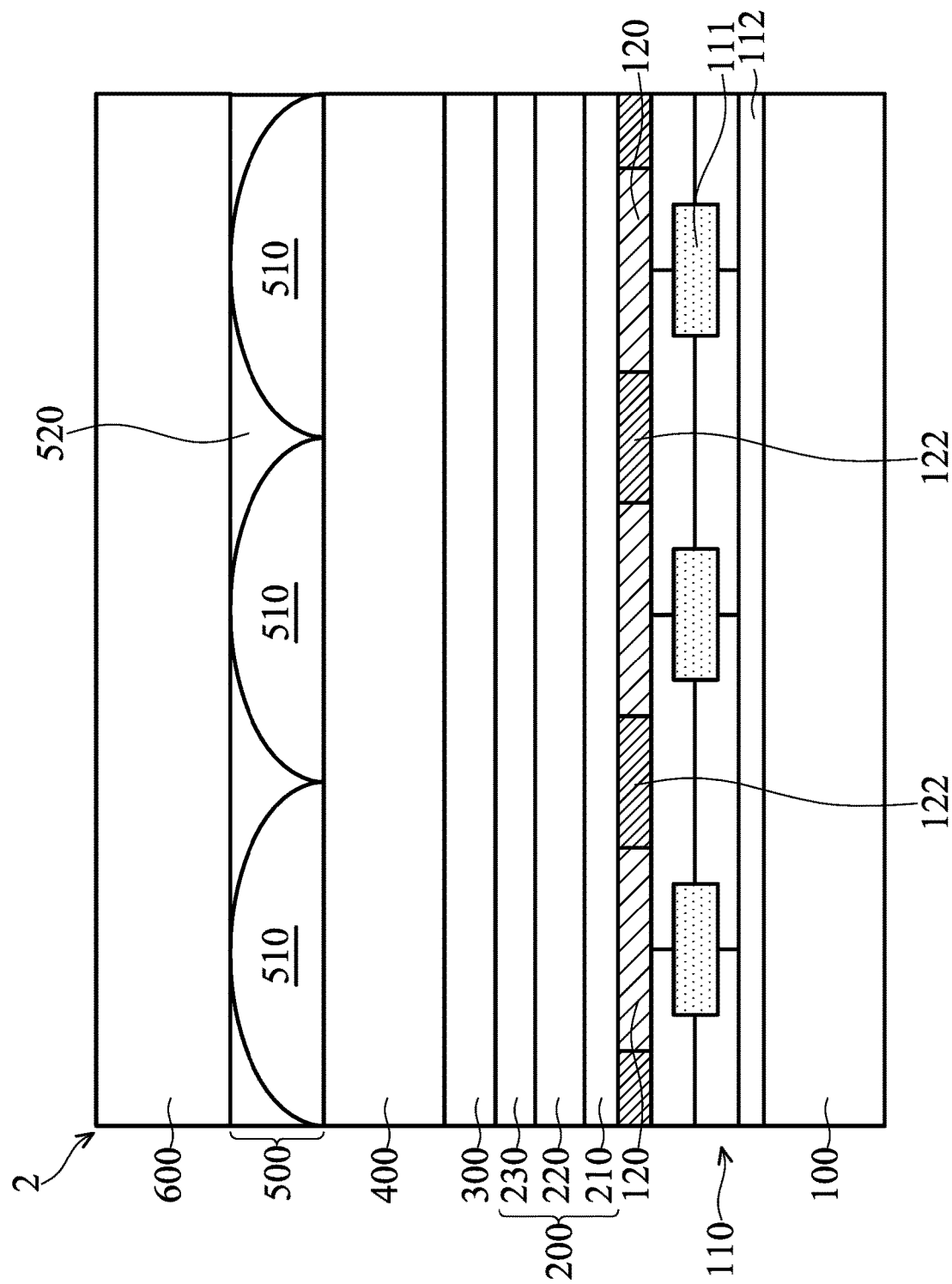
Figure 1C:
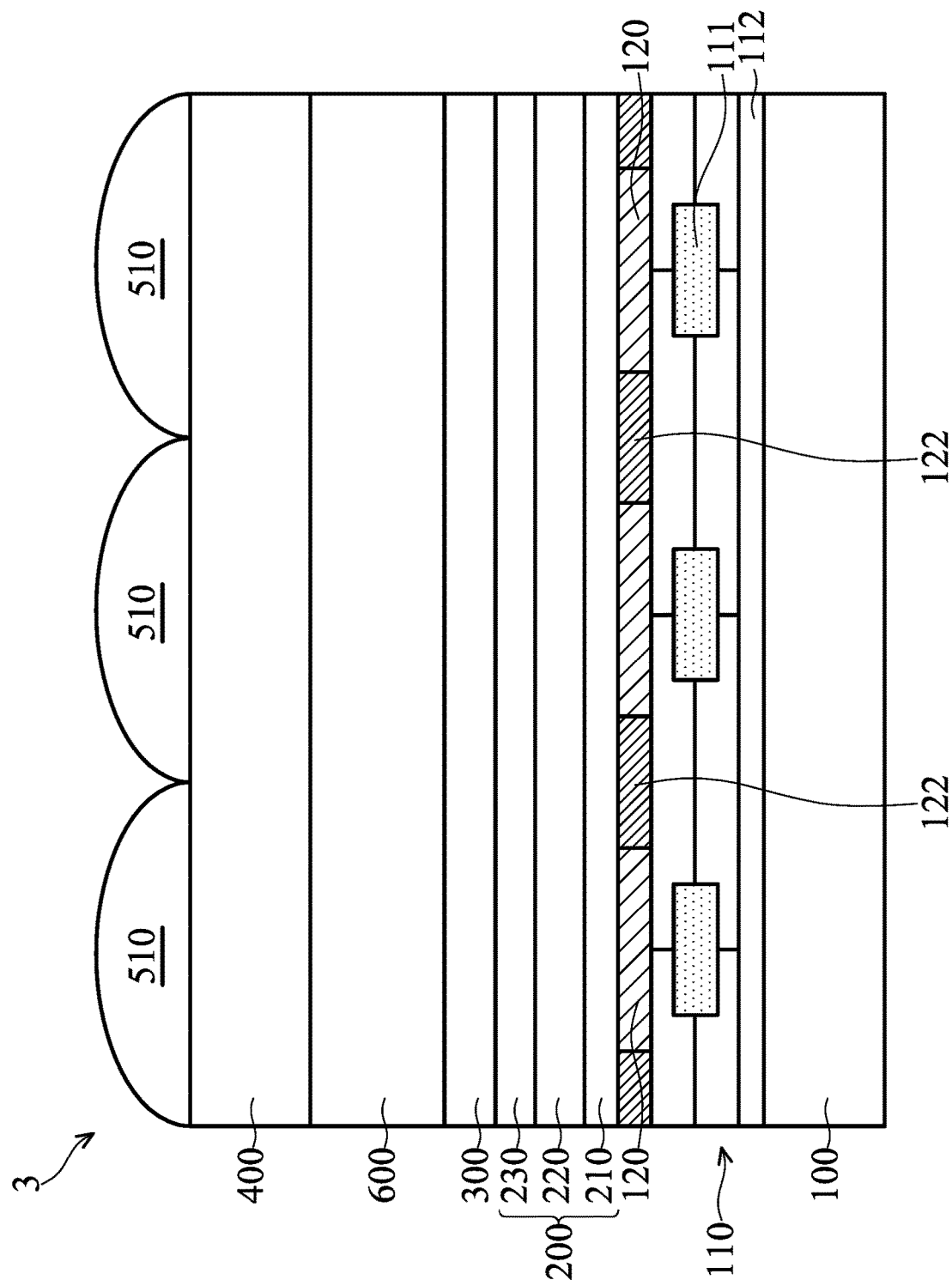

FIGS. 1A-1C are schematic cross-sectional views of an image sensor structure, according to some embodiments of the disclosure.

Referring to FIG. 1A, an image sensor structure 1 is provided, the image sensor structure includes a substrate 100, a readout circuit array 110, a photoelectric module 200 including photoelectric layer 220, and a filter layer 600. In some embodiments, the readout circuit array 110 is formed on the substrate 100. In some embodiments, the filter layer 600 is formed on the readout circuit array 110. In some embodiments, the photoelectric module 200 including photoelectric layer 220 is formed between the readout circuit array 110 and the filter layer 600. In some embodiments, the readout circuit array 110, the photoelectric module 200 and the filter layer 600 is form on the substrate 100 in order. In the following, the content will be described in the stacking order of the image sensor structure 1 for clarity.

In some embodiments, the substrate 100 may be, or include, a bulk semiconductor substrate, or a semiconductor-on-insulator (SOI) substrate. The substrate 100 may be doped, for example, using p-type dopants or n-type dopants or undoped. In general, the semiconductor-on-insulator substrate includes a film layer of semiconductor material formed on the insulating layer. For example, the insulating layer may be a silicon oxide layer, a silicon nitride layer, a poly-silicon layer, combination thereof, or a stack of the foregoing film layers. The insulating layer is disposed on a substrate, such as silicon (Si) substrate. Other substrates may also be used, such as a multilayer substrate or a gradient substrate. In some embodiments, the semiconductor material of the substrate 100 may include silicon with different crystal planes, in some embodiments, the substrate 100 may be a semiconductor substrate or a ceramic substrate, such as a Gallium Arsenide (GaAs) substrate, Gallium Nitride (GaN) substrate, a silicon carbide (SiC) substrate, an aluminum nitride (AlN) substrate, or a sapphire substrate.

In some embodiments, the readout circuit array 110 includes multiple readout transistor units 111 arranged in two dimension (2D) array on a base layer 112. Each readout transistor unit 111 includes multiple metal oxide semiconductor field effect transistors (MOSFETs) or thin film transistors (TFTs), or a combination thereof. The readout transistor unit 111 has one terminal contact with bottom contact pads 120, and has one signal output terminal connecting with outer circuits. The output signal can be either analog signal or digital signals depending on the circuit design.

In some embodiments, the image sensor structure 1 further includes isolation materials 122 disposed between the bottom contact pads 120, and the bottom contact pads 120 are formed on the readout circuit array 110. In some embodiments, the bottom contact pads 120 may be used as wiring in the readout circuit array 110 and/or a bottom electrode of the subsequently formed photoelectric module 200. For example, the bottom contact pads 120 may be disposed between the readout circuit array 110 and the subsequently formed photoelectric module 200.

In some embodiments, the bottom contact pads 120 may be, or include, a conductive material such as a metal, a metal nitride, a conductive semiconductor material, one or more suitable conductive material, or a combination thereof. In some embodiments, the metal may be gold (Au), nickel (Ni), platinum (Pt), palladium (Pd), iridium (Ir), titanium (Ti), chromium (Cr), tungsten (W), aluminum (Al), copper (Cu), or a combination thereof. The semiconductor material may be polycrystalline, silicon or polycrystalline germanium. In some embodiments, the bottom contact pads 120 may be transparent conductive layer, such as Indium tin oxide (ITO) or Indium zinc oxide.

In some embodiments, the photoelectric module 200 is formed on the bottom contact pads 120. In some embodiments, the photoelectric module 200 includes a first carrier transport layer 210, a photoelectric layer 220 formed on the first carrier transport layer 210, and the second carrier transport layer 230 formed on the photoelectric layer 220. In some embodiments, the photoelectric layer 220 is formed between the first carrier transport layer 210 and the second carrier transport layer 230. In some embodiments, the first carrier transport layer 210 is formed between the bottom contact pads 120 and the photoelectric layer 220 and the second carrier transport layer 230 is formed between the photoelectric layer 220 and the subsequently formed conductive layer 300.

In some embodiments, the first carrier transport layer 210 and the second carrier transport layer 230 is used to transport the carrier, such as electron or hole, into or out of the photoelectric layer 220. That is, the first carrier transport layer 210 and the second carrier transport layer 230 may be an electron transport layer (ETL) and/or a hole transport layer (HTL). For example, the first carrier transport layer 210 and the second carrier transport layer 230 may be both the electron transport layer or the hole transport layer, or the first carrier transport layer 210 is the electron transport layer and the second carrier transport layer 230 is the hole transport layer, or the first carrier transport layer 210 is the hole transport layer and the second carrier transport layer 230 is the electron transport layer.

In some embodiments, the electron transport layer may be, or include, electron transport materials, such as ZnO, $TiO_2$, $C_{60}$, the like or one or more suitable electron transport material. In some embodiments, the thickness of the electron transport layer may be between about 1 nm to about 200 nm. In some embodiments, the hole transport layer is made of hole transport materials, such as $MoO_3$, $WO_3$, Poly-3,4-Ethylenedioxythiophene (PEDOT), the like or one or more suitable hole transport material. In some embodiments, the thickness of the hole transport layer may be between about 1 nm to about 200 nm.

In some embodiments, the photoelectric layer 220 is used to perform the photoelectric effect. In some embodiments, the photoelectric layer 220 is made of organic material, quantum dot (QD) materials, Perovskite, one or more suitable photoelectric material, or a combination thereof. In some embodiments, the thickness of the photoelectric layer 220 may be between about 100 nm to about 5000 nm.

As shown in FIG. 1A, the image sensor structure 1 further includes a conductive layer 300, and conductive layer 300 is formed on the second carrier transport layer 230. In some embodiments, the conductive layer 300 is used as top electrode of the photoelectric module 200 thereunder. For example, the conductive layer 300 may be disposed between the photoelectric module 200 and the subsequently formed protective layer.

In some embodiments, the materials of the conductive layer 300 may be the same as or different from those of the bottom contact pads 120. In some embodiments, the conductive layer 300 is made of a conductive material such as a metal, a metal nitride, a semiconductor material, one or more suitable conductive material, or a combination thereof. In some embodiments, the metal may be gold, nickel, platinum, palladium, iridium, titanium, chromium, tungsten, aluminum, copper, one or more suitable material, or a combination thereof. The semiconductor material may be polycrystalline silicon or polycrystalline germanium. In some embodiments, the conductive layer 300 is transparent conductive layer.

In some embodiments, the image sensor structure 1 further includes a protective layer 400 formed on the conductive layer 300. In some embodiments, the protective layer 400 is formed between the photoelectric module 200 and the subsequently formed filter layer 600 to protect features under the protective layer 400. In some embodiments, the filter layer 600 may be an absorptive filter layer, wherein the filtering ability of the absorptive filter layer is based on the absorption characteristics of the materials containing in the absorptive filter layer. Since the absorptive filter layer is almost angle-independent, the absorptive filter layer may effectively reduce the blue-shift that occurs when using a multi-film interference-type filter. Moreover, the thickness of the absorptive filter layer is smaller than that of the interference-type filter. Therefore, the image sensor structure may reduce blue-shift while a large inclined incident light is irradiated onto the image sensors structure. The image sensors structure may be easily miniaturized. In some embodiments, the filter layer 600 is a long pass filter.

In some embodiments, the image sensor structure 1 further includes micro-lens 510. In some embodiments, the micro-lens 510 is formed on the filter layer 600. In some other embodiments, the micro-lens 510 is formed on the protective layer 400. In some other embodiments, the micro-lens 510 is formed s between the protective layer 400 and the filter layer 600. In some embodiments, the micro-lens 510 is used as a concentrator element which increases light collection efficiency to the photoelectric module 200. In some embodiments, the material of the micro-lens 510 is made of acrylic, such as polymethylmethacrylae (PMMA) or polyglycidylmethacrylate (PGMA), high refractive index (n) material, one or more suitable optically transparent micro-lens materials, or a combination thereof. In some embodiments, the shape of the micro-lens 510 is hemispherical shape. In some embodiments, the curvature of the micro-lens 510 may be adjusted. In some embodiments, a filling material with low refractive index value is formed between each of the micro-lens 510. In some embodiments, the micro-lens 510 is formed to correspond with the readout transistor units 111. In some embodiments, the distance between adjacent micro-lens 510 aligns with a symmetry axis of the readout transistor units 111 in the readout circuit array 110. In other words, the distance W between the symmetry axes of adjacent readout transistor units 111 is substantially the same as the width of the micro-lens 510.

For the purpose of clarity, the same or similar descriptions are not repeated in the following.

Referring to FIG. 1B, an image sensor structure 2 includes the micro-lens 510 formed between the protective layer 400 and the filter layer 600. A filling material 520 is formed on the micro-lens 510. The filling material 520 is made of phosphosilicate glass (PSG), borophosphosilicate glass (BPSG), low dielectric constant (low-k) dielectric material, or one or more applicable dielectric materials. Examples of low dielectric constant dielectric materials include fluorinated silica glass (FSG), carbon doped silicon oxide, amorphous fluorinated carbon, parylene, bis-benzocyclobutenes (BCB), polyimides, and combinations thereof. The micro-lens 510 and the filling material 520 may be formed as a micro-lens structure 500. Thus, the protective layer 400 may protect features under the protective layer 400, such as the photoelectric module 220 and the readout circuit array 110. In some embodiments, the filling material 520 provides a flat top surface, and the filter layer 600 is formed on the flat top surface of the micro-lens structure 500 and over the micro-lens 510, thus the filling material 520 provides more flexible manufacturing steps and methods to form the image sensor 2.

Referring to FIG. 1C, the micro-lens 510 in an image sensor structure 3 is formed on the protective layer 400 and the protective layer 400 is formed on the filter layer 600 in accordance with some other embodiments. Thus, the protective layer 400 may protect features under the protective layer 400, such as the filter layer 600, the photoelectric module 220, and the readout circuit array 110.

The image sensor structure disclosed in the disclosure may be applied in the narrow hand IR camera for face sensing, motion detection, and/or machine vision. The image sensor structure disclosed in the disclosure may also be applied in narrow hand time of flight (TOF) sensor for augmented reality (AR) and/or virtual reality (VR) application. The image sensor may be a front side image (FSI) sensor or a back side image (BSI) sensor.

In the following, the detailed relationship between the filter layer 600 and the photoelectric layer 220 will be described.

Figure 2A:
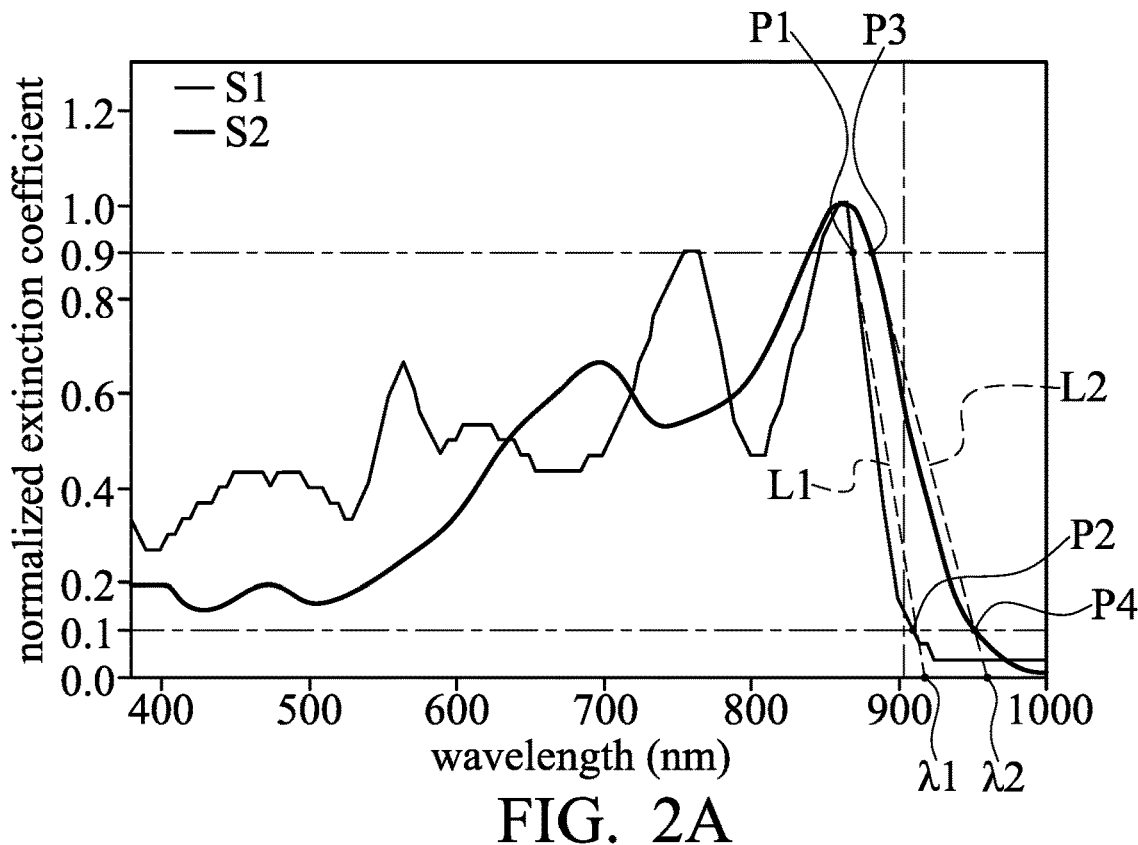
FIG. 2A is schematic graph of normalized extinction coefficient versus wavelength (nm), according to some embodiments of the disclosure.

Referring to FIG. 2A, which is schematic graph of normalized extinction coefficient versus wavelength (nm), according to some embodiments. It is notice that, by selecting specific combinations of the photoelectric layer 220 and the filter layer 600, the optical performances of the imagesensor are improved accordingly to some embodiments of the disclosure. The quantum efficiency (QE), peak shift phenomenon and FOV may be improved.

As shown in FIG. 2A, the x-axis presents the normalized extinction coefficient of the photoelectric layer 220 and the filter layer 600, and the y-axis presents wavelength (nm) corresponding to the normalized extinction coefficient. In other words. FIG. 2A shows the normalized extinction coefficient spectrum of the photoelectric layer 220 and the filter layer 600. Hereinafter, the normalized extinction coefficient spectrum of the filter layer 600 refers to "a first spectrum SI" and the normalized extinction coefficient spectrum of the photoelectric layer 220 refers to "a second spectrum S2". Furthermore, the normalized extinction coefficient spectrum is represented with a log curve.

In general, the term "normalized" means that the values are scaled into the range of 0 to 1 but the original distribution of the values is still maintained. For example, the maximum extinction coefficient among all of the extinction coefficients may be scaled into 1, and the minimum extinction coefficient among all of the extinction coefficients may be scaled into 0 after being normalized. In disclosure, the extinction coefficients are normalized by a maximum extinction coefficient of a peak of the first spectrum S1 or the second spectrum S2, wherein the peak of the first spectrum S1 or the second spectrum S2 may have the longest wavelength of all of the peaks. In other words, the extinction coefficients are normalized by the peak value corresponding to the longest wavelength.

In some embodiments, the first spectrum S1 of the filter layer 600 defines a first wavelength $\lambda 1$ corresponding to a first line L1, and the second spectrum S2 of the photoelectric layer 220 defines a second wavelength $\lambda 2$ corresponding to a second line L2. In some embodiments, the second wavelength $\lambda 2$ is longer than the first wavelength $\lambda 1$. In some embodiments, the second wavelength $\lambda 2$ is longer than the first wavelength $\lambda 1$ by about 10 nm to about 150 nm.

In detail, as shown in FIG. 2A, the first wavelength $\lambda 1$ corresponds to a first line L1 passing through a first point P1 and a second point P2 on a curve of the first spectrum S1 of the finer layer 600. In some embodiments, the first point P1 aligns with an extinction coefficient of 0.9 and the second point P2 aligns with an extinction coefficient of 0.1. In some embodiments, the values of the extinction coefficient aligning with the first point P1 and the second point P2 may be adjusted.

In particular, there may be numerous points aligning with the extinction coefficient of 0.9. Thus, the first point P1 is the point which aligns with the extinction coefficient of 0.9 and falls within the longest wavelength segment of the first spectrum S1. In some embodiments, the first point P1 falls within the right segment of the peak having the longest wavelength of the first spectrum S1. Similarly, there may be numerous points aligning with the extinction coefficient of 0.1. Thus, the second point P2 is the point which aligns with the extinction coefficient of 0.1 and falls within the longest wavelength segment of the first spectrum S1. In some embodiments, the second point P2 falls within the right segment of the peak having the longest wavelength of the first spectrum S1. In some embodiments, the first wavelength $\lambda 1$ is defined by the first line L1 extending to a position of extinction coefficient of 0. That is, the first wavelength $\lambda 1$ is defined by a cross point of the first line L1 and line of the extinction coefficient of 0.

Similarly, the second wavelength $\lambda 2$ corresponds to a second line L2 passing through a third point P3 and a fourth point P4 on a curve of the second spectrum S2 of the photoelectric layer 220. In some embodiments, the third point P3 may align with an extinction coefficient of 0.9 and the fourth point P4 may align with an extinction coefficient of 0.1. In some embodiments, the values of the extinction coefficient aligning with the third point P3 and the fourth point P4 may be adjusted according to the requirements.

In particular, there may be numerous points aligning with the extinction coefficient of 0.9. Thus, the third point P3 is the point which aligns with the extinction coefficient of 0.9 and falls within the longest wavelength segment of the second spectrum S2. In some embodiments, the third point P3 falls within the right segment of the peak having the longest wavelength of the second spectrum S2. Similarly, there may be numerous points align ng with the extinction coefficient of 0.1. Thus, the fourth point P4 is the point which aligns with the extinction coefficient of 0.1 and falls within the longest wavelength segment of the second spectrum S2. In some embodiments, the fourth point P4 falls within the right segment of the peak having the longest wavelength of the second spectrum S2. In some embodiments, the second wavelength $\lambda 2$ is defined by the second line L2 extending to a position of extinction coefficient of 0. That is, the second wavelength $\lambda 2$ is defined by a cross point of the second line L2 and line of the extinction coefficient of 0.

Figure 2B:
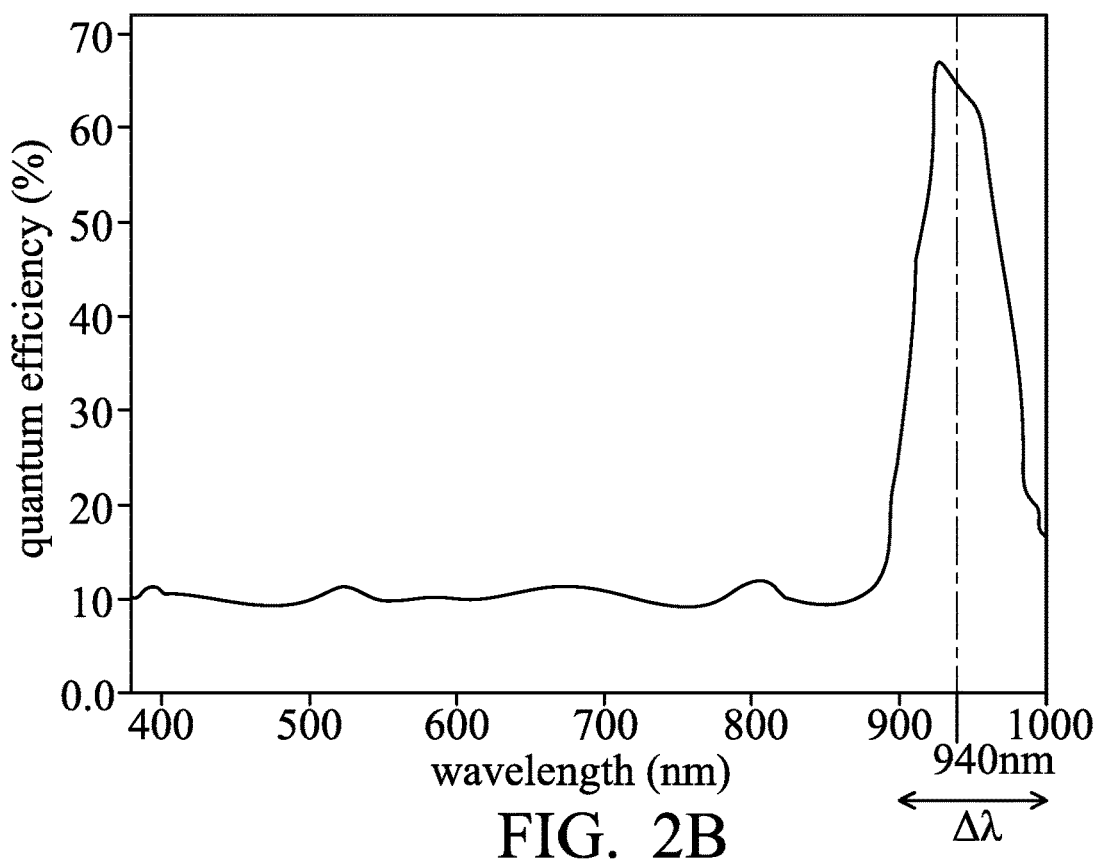
FIG. 2B is schematic graph of quantum efficiency (%) versus wavelength (nm), according to some embodiments of the disclosure.

Referring to FIG. 2B, which is schematic graph of quantum efficiency (%) versus wavelength (nm), according to some embodiments. In some embodiments, the filter layer 600 is a long pass filter, thus only the light with wavelength longer than the critical wavelength of the filter layer 600 may pass through the filter layer 600. In addition, the extinction coefficient of the photoelectric layer 220 may affect the quantum efficiency and the wavelength of the sensing light of the image sensor structure. In some embodiments, some of photons (e.g. IR photons) may reach the photoelectric layer 220, while others photons (e.g. visible photons) are blocked by filter layer 600. Accordingly, the difference $\Delta\lambda$ between the first wavelength $\lambda 1$ of the filter layer 600 and the second wavelength λ2 of the photoelectric layer 220 presents the wavelength range of the sensing light of image sensor structure.

To achieve narrow band imaging, the materials of photoelectric layer 220 and filter layer 600 need to be well selected. There are numerous photoelectric layers, such as organic bulk heterojunction (BHJ) photodetector, perovskite photodetector, and quantum dot (QD) photodetector, or a combination thereof can provide tunable spectrum range from visible wavelength (400-700 nm) to infrared (IR) (700-2000 nm). The BHJ includes the blends of conjugated polymer and/or small molecular. The QD materials are PbS, PbSe, CdS, CdSe, InP, InAs, InGaP, InGaAs, the like and combination thereof. The size of QD is ranging from 2 nm to 15 nm. Each quantum dot is surrounded by organic or inorganic ligand for keeping the quantum confinement effects, while the carrier transport between QDs is still allowed. The organic ligand includes 3-Mercaptopropionic acid (MPA), 1,2-Ethanedithiol (EDT), Ethylenedi amine (EDA), the like and combination thereof. The inorganic ligands are iodide, bromide and chloride. The Perovskite materials are inorganic-organic hybrid or pure inorganic materials. The inorganic-organic hybrids are $MAPbBr_3$, $MAPbI_3$, $FAPbI_3$, $MAPbSnI_3$, $MASnI_3$, the like and combination thereof. The inorganic materials are $CsPbI_3$, and $CsSnI_3$, respectively. The pixelated bottom contact pads 120 are conductive materials, such as Al, Cu, AlCu, Ti/Al/Ti, W, Ag, ITO, IZO, Graphene, CNT, Ag nanowire, and the like. The first carrier transport layer 210 and second carrier transport layer 230 are selected from ZnO, AZO, MoO3, WO3, NiO, PEDOT:PSS, PFN, or PEIE. The conductive layer 300 is transparent conductive layer, such as ITO, IZO, Ag nanowire, carbon nanotubes, and graphene. The protective layer 400 is a multifilm including pure inorganic film or organic/inorganic stacking filtns. The inorganic films are $SiO_2$, SiN, SiON, SiH, $Al_2O_3$, $TiO_2$, the like and combination thereof. The filter layer 600 is absorbing type filters such as organic metal complex dye, or inorganic films.

For example, when the material of the filter layer 600 is organic long pass filter; the material of the photoelectric layer 220 is organic bulk heteroj unction photodiode or Perovskite photodi ode or QD photodiode; the first wavelength λ1 is 900 nm; the second wavelength λ2 is 950 nm; and the difference Δλ is 50 nm as shown in FIG. 2A. Accordingly, the wavelength range of the sensing light of image sensor structure is 920 nm to 970 nm, and when the wavelength of the sensing light is 940 nm, the quantum efficiency of the sensing light is the maxima.

Figure 3A:
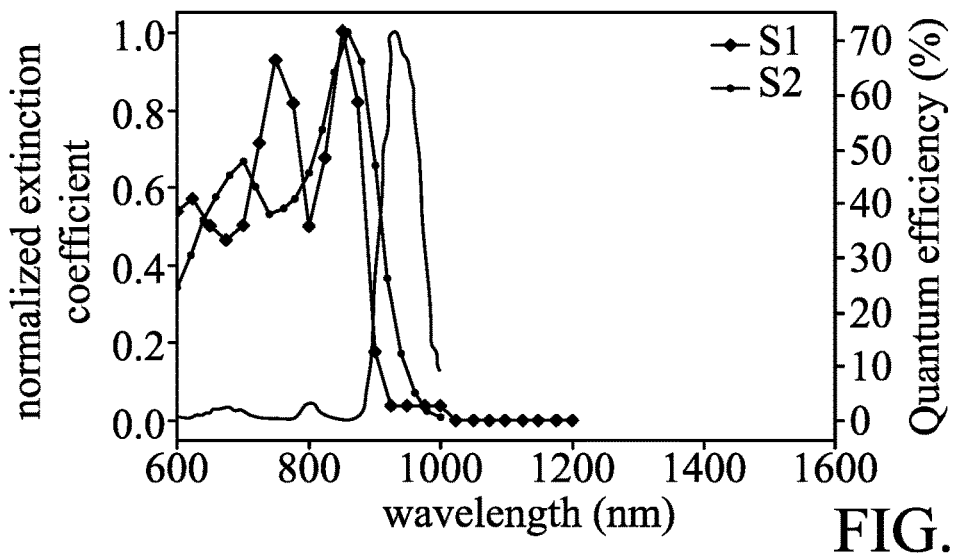
FIGS. 3A-3F are schematic graphs of normalized extinction coefficient and quantum efficiency (%) versus wavelength (nm), according to some embodiments of the disclosure.

Referring to FIGS. 3A-3F, which are schematic graphs of normalized extinction coefficient and quantum efficiency (%) versus wavelength (nm), according to some embodiments of the disclosure. In other words, each of FIGS. 3A-3F is overlay of the graph of normalized extinction coefficient versus wavelength (nm) and the graph of quantum efficiency (%) versus wavelength (nm). For example, the FIG. 3A is overlay of FIGS. 2A and 2B. As shown in FIG. 3A, the difference Δλ substantially corresponds to the wavelength range of the sensing light.

Figure 3B:
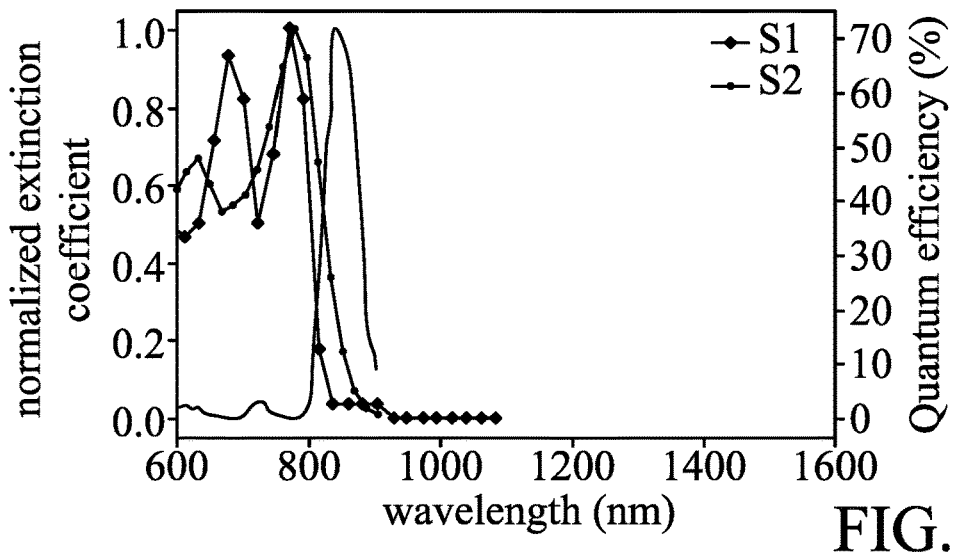

As shown in FIG. 3B, for example, when the material of the filter layer 600 is organic long pass filter; the material of the photoelectric layer 220 is organic bulk heterojunction photodiode; the first wavelength λ1 is 810 nm; the second wavelength λ2 is 860 nm; and the difference Δλ is 50 nm. Accordingly, the wavelength range of the sensing light of image sensor structure is 830 nm to 880 nm, and when the wavelength of the sensing light is 850 nm, the quantum efficiency of the sensing light is the maxima.

Figure 3C:
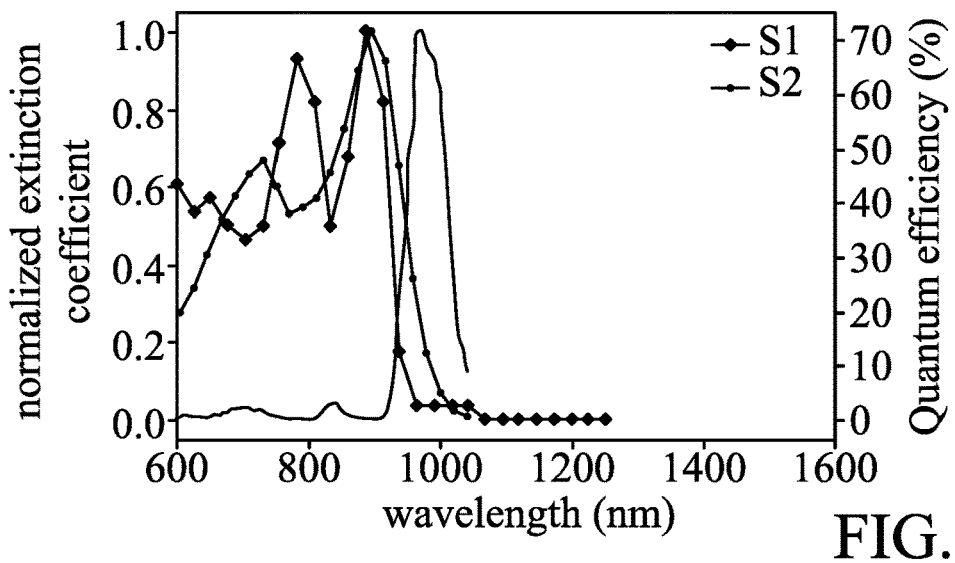

As shown in FIG. 3C, for example, when the material of the filter layer 600 is organic long pass filter; the material of the photoelectric layer 220 is organic bulk heterojunction photodiode; the first wavelength λ1 is 940 nm; the second wavelength λ2 is 990 nm; and the difference Δλ is 50 nm. Accordingly, the wavelength range of the sensing light of image sensor structure is 960 nm to 1100 am, and when the wavelength of the sensing light is 980 nm, the quantum efficiency of the sensing light is the maxima.

Figure 3D:
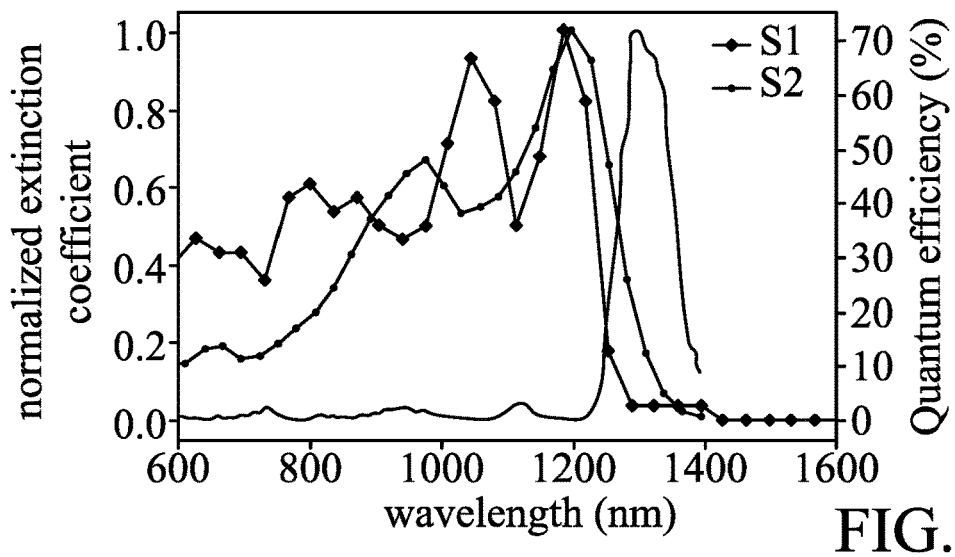

As shown in FIG. 3D, for example, when the material of the filter layer 600 is organic long pass filter; the material of the photoelectric layer 220 is organic bulk heterojunction photodiode; the first wavelength λ1 is 1270 nm; the second wavelength λ2 is 1320 nm; and the difference Δλ is 50 nm. Accordingly, the wavelength range of the sensing light of image sensor structure is 1290 to 1340, and when the wavelength of the sensing light is 1310 nm, the quantum efficiency of the sensing light is the maxima.

Figure 3E:
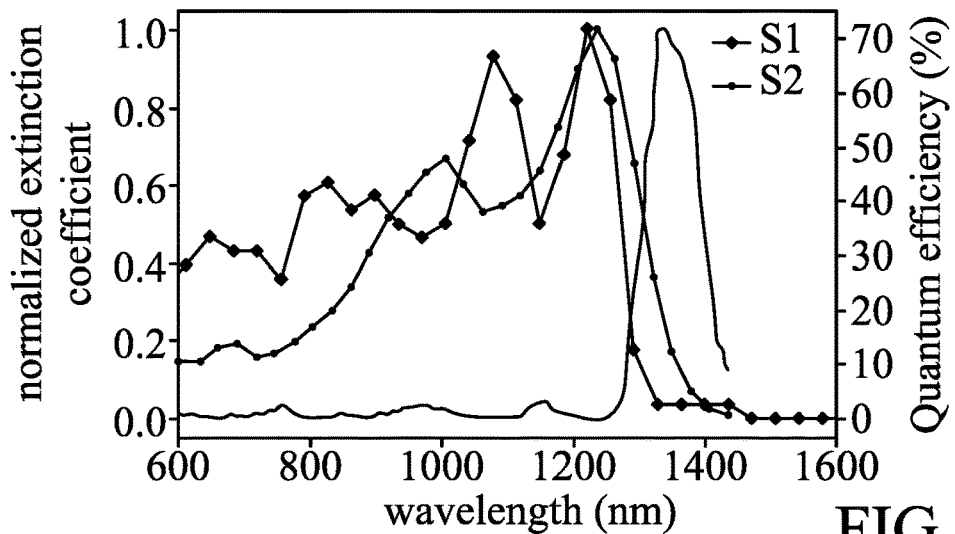

As shown in FIG. 3E, for example, when the material of the filter layer 600 is organic long pass filter; the material of the photoelectric layer 220 is organic bulk heteroj unction photodiode; the first wavelength λ1 is 1310 nm; the second wavelength λ2 is 1360 nm; and the difference λ2, is 50 nm. Accordingly, the wavelength range of the sensing light of image sensor structure is 1330 nm to 1380 nm, and when the wavelength of the sensing light is 1350 nm, the quantum efficiency of the sensing light is the maxima.

Figure 3F:
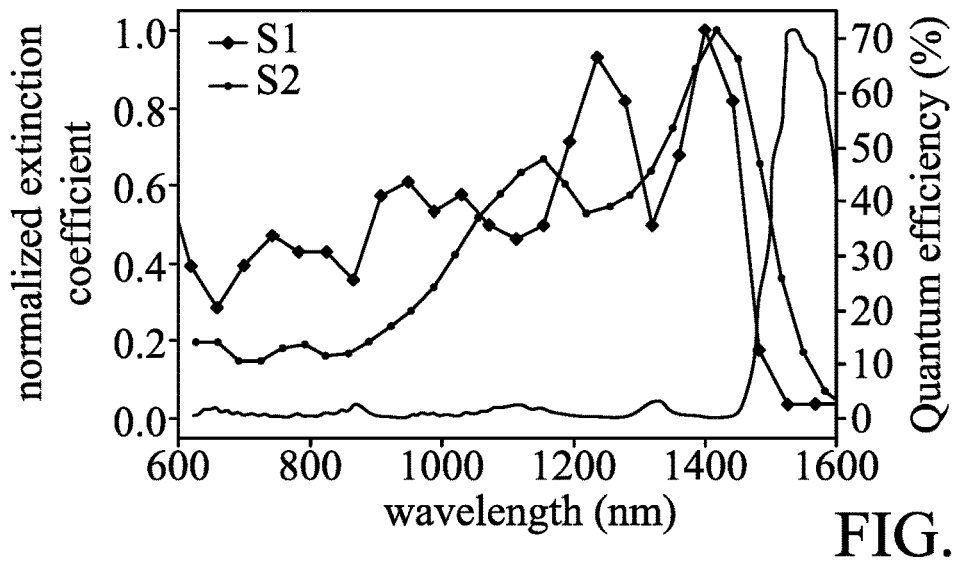

As shown in FIG. 3F, for example, when the material of the filter layer 600 is organic long pass filter; the material of the photoelectric layer 220 is organic bulk heteroj unction photodiode; the first wavelength λ1 is 1510 nm; the second wavelength λ2 is 1560 nm; and the difference λ2, is 50 nm. Accordingly, the wavelength range of the sensing light of image sensor structure is 1530 to 1580, and when the wavelength of the sensing light is 1550 nm, the quantum efficiency of the sensing light is the maxima.

Accordingly, the image sensor structure of the disclosure may provide high quantum efficiency when the wavelength of the sensing light is longer than 800 nm, 850 nm, 900 nm, 950 nm, 1000 nm, 1050 nm, 1100 nm, 1150 nm, 1200 nm, 1250 nm, 1300 nm, 1350 nm, 1400 nm, 1450 nm, 1500 nm, 1550 nm or one or more suitable wavelength for the long pass filter layer 600. In some embodiments, the image sensor structure provides high quantum efficiency in the near-infrared region. The image sensor structure may expand sensing wavelength from 850 nm to 1550 nm by selecting different materials of the photoelectric layer 220 and corresponding filter layer 600.

FIGS. 4A-4D are schematic views of energy gaps of the first carrier transport layer 210, the photoelectric layer 220, and the second carder transport layer 230, according to some embodiments. Referring to FIGS. 4A-4D, the x-axis presents the energy gaps of the first carrier transport layer 210, the photoelectric layer 220 and the second carrier transport layer 230.

Figure 4A:
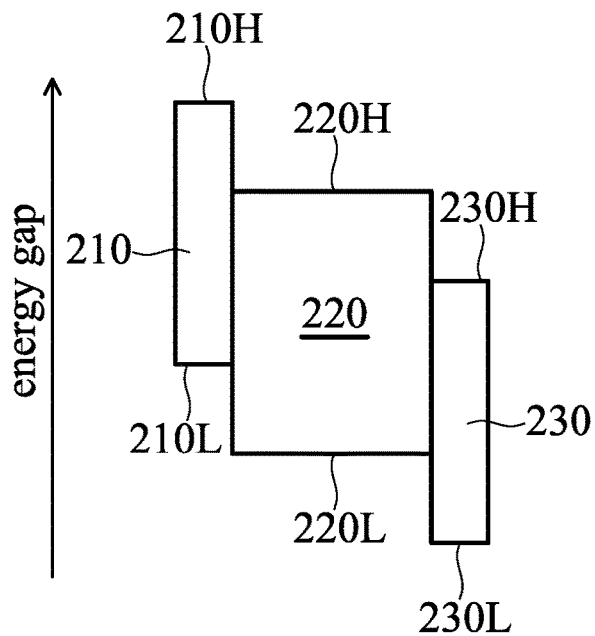
FIGS. 4A-4D are schematic views of energy gaps of the first carrier transport layer, the photoelectric layer, and the second carrier transport layer, according to some embodiments of the disclosure.

As shown in FIG. 4A, the first carrier transport layer 210 is HTL and the second carrier transport layer 230 is ETL. The first carrier transport layer 210 has energy gap ranged in the maximum energy gap 210H to the minimum energy gap 210L. The photoelectric layer 220 has energy gap ranged in the maximum energy gap 220H to the minimum energy gap 220L. The second carrier transport layer 230 has energy gap ranged in the maximum energy gap 230H to the minimum energy gap 230L. In some embodiments, the maximum energy gap 210H is higher than the maximum energy gap 220H, and the maximum energy gap 220H is higher than the maximum energy gap 230H. In some embodiments, the minimum energy gap 210L is higher than the minimum energy gap 220L, and the minimum energy gap 220L is higher than the minimum energy gap 230L. In some embodiments, thus, the average energy gaps of the first carrier transport layer 210, the photoelectric layer 220, and the second carrier transport layer 230 are progressively decreased.

Figure 4C:
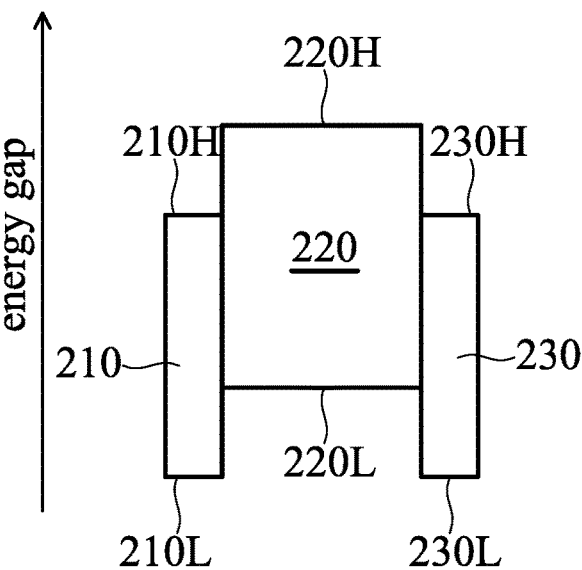
Figure 4B:
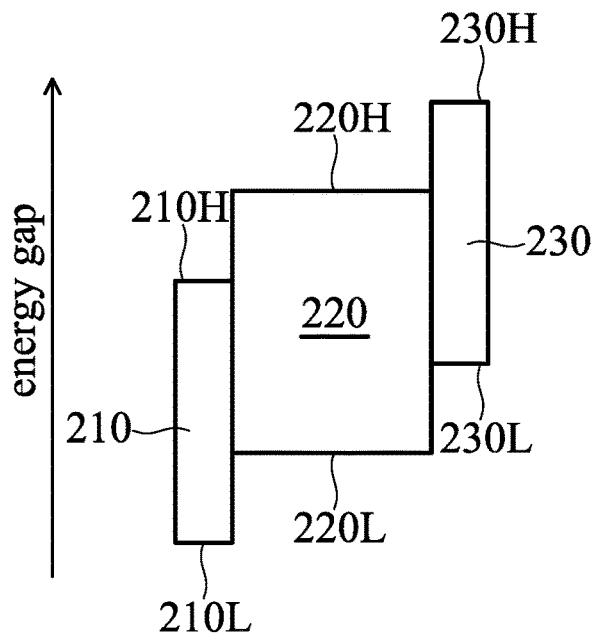

As shown in FIG. 4B, the first carrier transport layer 210 is ETL and the second carrier transport layer 230 is HTL, thus the average energy gaps of the first carrier transport layer 210, the photoelectric layer 220, and the second carrier transport layer 230 are progressively increased.

As shown in FIG. 4C, the first carrier transport layer 210 and the second carrier transport layer 230 are ETL, thus the average energy gap of the photoelectric layer 220 is higher than the average energy gaps of the first carrier transport layer 210 and the second carrier transport layer 230.

Figure 4D:
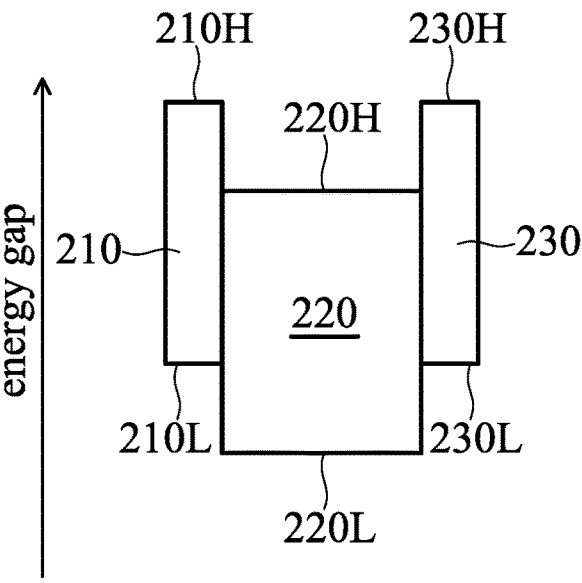

As shown in FIG. 4D, the first carrier transport layer 210 and the second carrier transport layer 230 are ETL, thus the average energy gaps of the first carrier transport layer 210 and the second carrier transport layer 230 are higher than the average energy gap of the photoelectric layer 220.

FIGS. 5A-5H are schematic cross-sectional views of an image sensor structure at various stages of fabrication, according to some embodiments. FIGS. 5A-5H shows schematic cross-sectional views of the image sensor structure 1 shown in FIG. 1A as an example.

Figure 5A:
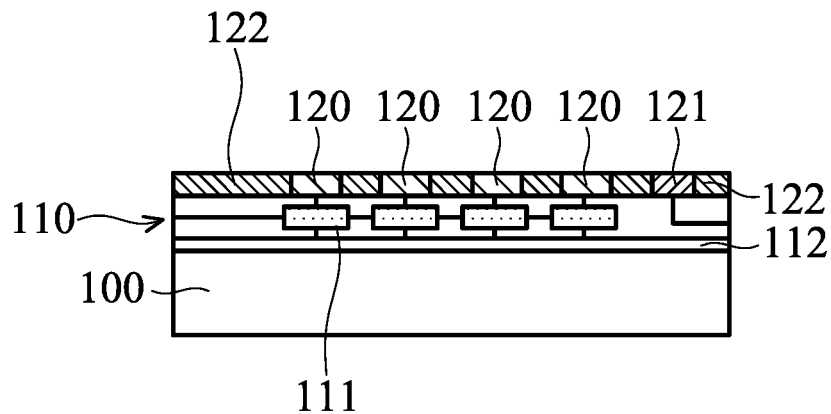
FIGS. 5A-5H are schematic cross-sectional views of an image sensor structure at various stages of fabrication, according to some embodiments of the disclosure.

Referring to FIG. 5A, the substrate 100 is formed, and the readout circuit array 110 is formed on the substrate 100. The pixelated bottom contact pads 120 are defined upon each readout transistor units 111. Between each bottom contact pad 120, the isolation materials 122 is placed. In some embodiments, top contact pad 121 is formed on the substrate 100 and adjacent to the isolation materials 122. In some embodiments, the bottom contact pads 120 are formed on the readout circuit array 110. In some embodiments, the readout circuit array 110 is formed on the substrate 100. The readout circuit array 110 includes multiple transistors, capacitors or resistors. The fabrication process for forming the readout circuit array 110 and/or the bottom contact pad 120 and top contact pad 121 may be physical vapor deposition (PVD), chemical vapor deposition (CVD), atomic layer deposition (ALD), the like, another suitable process, or a combination thereof, and followed by a photoresist deposition, a photolithography, a develop and a dry/wet etching.

Figure 5B:
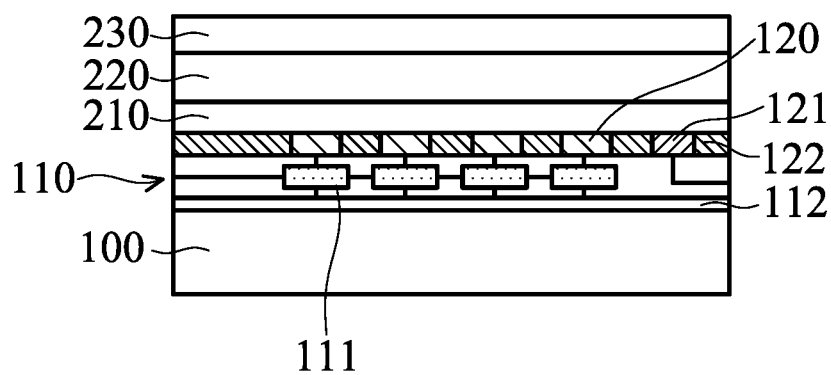

Referring to FIG. 5B, the first carder transport layer 210 is formed on the bottom contact pad 120, the photoelectric layer 220 is formed on the first carrier transport layer 210 and the second carrier transport layer 230 is formed on the photoelectric layer 220. In some embodiments, the first carrier transport layer 210, photoelectric layer 220 and the second carrier transport layer 230 may be formed by a deposition process, respectively. The deposition process for forming the first carrier transport layer 210, the photoelectric layer 220 and/or the second carrier transport layer 230 may be a spin-coating, a doctor-blading, a screen printing, or physical vapor deposition (PVD), chemical vapor deposition (CVD), atomic layer deposition (ALD), the like, another suitable process, or a combination thereof.

Figure 5C:
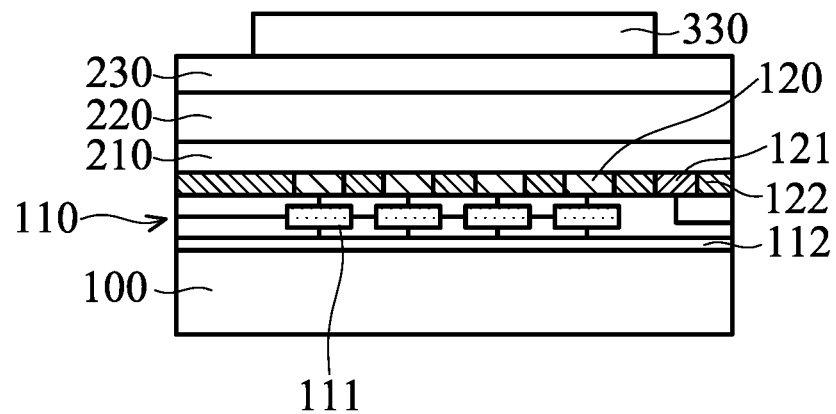

Referring to FIG. 5C, a patterned photoresist layer 330 is formed on the second carrier transport layer 230 and the area of the patterned photoresist layer 330 is the same or slightly bigger than the area of the readout circuit array 110. In some embodiments, the patterned photoresist layer 330 partially covers the second carrier transport layer 230. In some embodiments, a photoresist material (not shown) is formed on the second carrier transport layer 230 followed by patterning the photoresist material to form a patterned photoresist layer 330. In some embodiments, further processes are performed, such as exposure process, a annealing process, a developing process, the like, another suitable process, or a combination thereof.

Figure 5D:
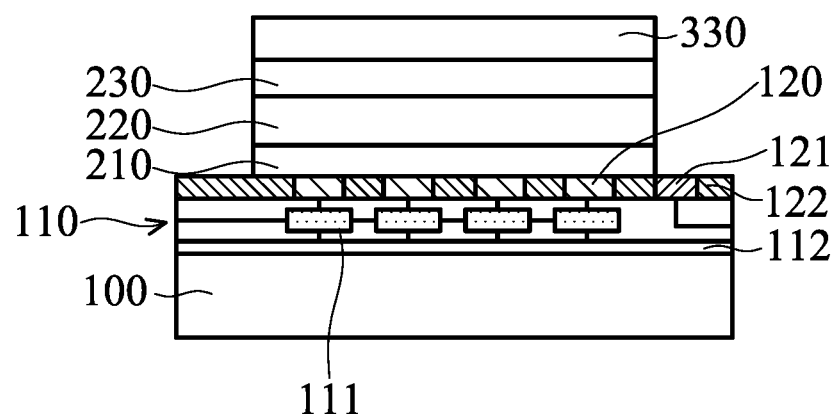

Referring to FIG. 5D, the second carrier transport layer 230, the photoelectric layer 220 and the first carrier transport layer 210 are etched by a dry etching processes using the patterned photoresist layer 330 as etching mask to expose a top surface of the top contact pad 121. In some embodiments, the patterned photoresist layer 330 defines an active area of the image sensor. In some embodiments, the patterned photoresist layer 330 is then removed by a stripe-off process, such as an aching process. In some embodiments, the photoelectric layer 220 and the patterned photoresist layer 330 are made of different materials. In some embodiments, the photoelectric material and the photoresist material are orthogonal. In other words, the photoelectric material is immiscible with the photoresist material during the deposition/developing/removing process. Thus, the patterned photoresist layer 330 is removed completely while the photoelectric layer 220 is not or almost no damaged after the removing process.

Figure 5E:
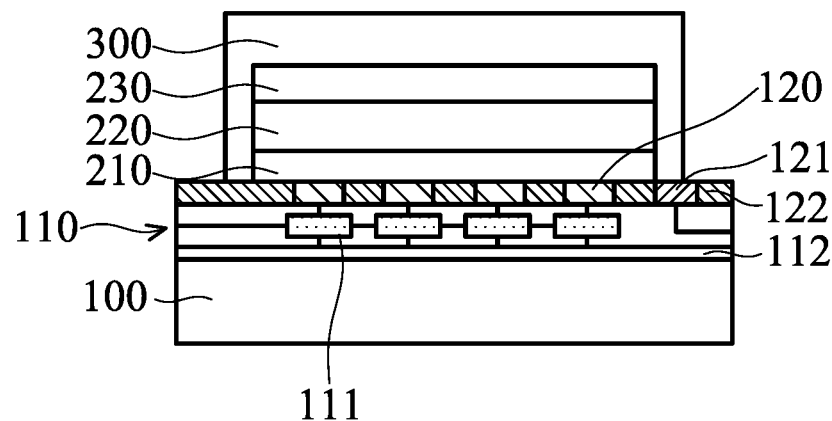

Referring to FIG. 5E, the conductive layer 300 is formed on the second carrier transport layer 230 by a deposition process. The deposition process for forming the conductive layer 300 may be a spin-coating, a doctor-blading, a screen printing, physical vapor deposition (PVD), chemical vapor deposition (CVD), atomic layer deposition (ALD), the like, another suitable process, or a combination thereof. In some embodiments, the conductive layer 300 is formed on a top surface of the second carrier transport layer 230 and the conductive layer 300 is in contact with the exposed top contact pad 121. At this stage, the bottom contact and the top contact of the photoelectric layer 220 are formed completely. The pixel size is defined by the contact area of each of the bottom contact pads 120 with the first carrier transport layer 210. All bottom contact pads 120 and top contact pad 121 are connecting to the readout circuit array 110 via the conductive wire below each of the bottom contact pads 120 and the top contact pad 121. The analog signal read from each pixel is further converted to digital signals by an ADC (Analog-to-Digital Converter).

Figure 5F:
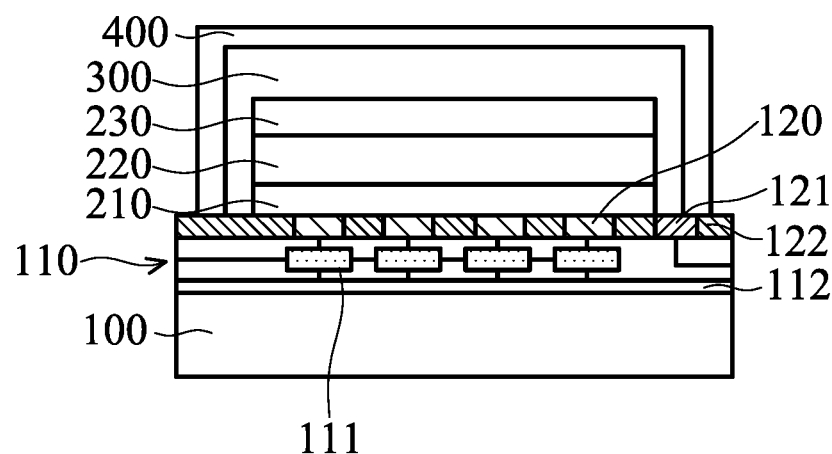

Referring to FIG. 5F, the protective layer 400 is formed on the conductive layer 300 by a deposition process. The deposition process for forming the protective layer 400 may be physical vapor deposition (PVD), chemical vapor deposition (CVD), atomic layer deposition (ALD), the like, another suitable process, or a combination thereof. In some embodiments, the protective layer 400 is formed on a top surface of the conductive layer 300 and on both side surfaces of the conductive layer 300.

Figure 5G:
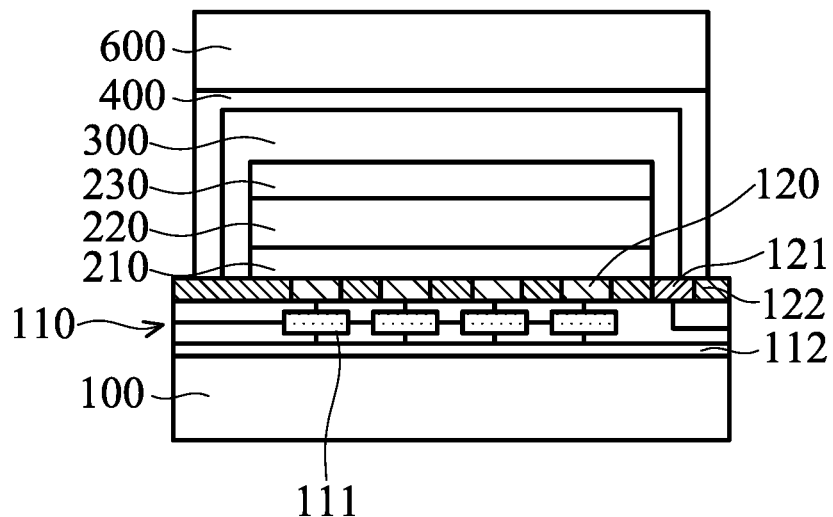

Referring to FIG. 5G, the filter layer 600 is formed on the protective layer 400 by a deposition process. The deposition process for forming the filter layer 600 may be a spin-coating, a doctor-blading, a screen printing, MOCVD, ALD, MBE, LPE, the like, another suitable process, or a combination thereof.

Figure 5H:
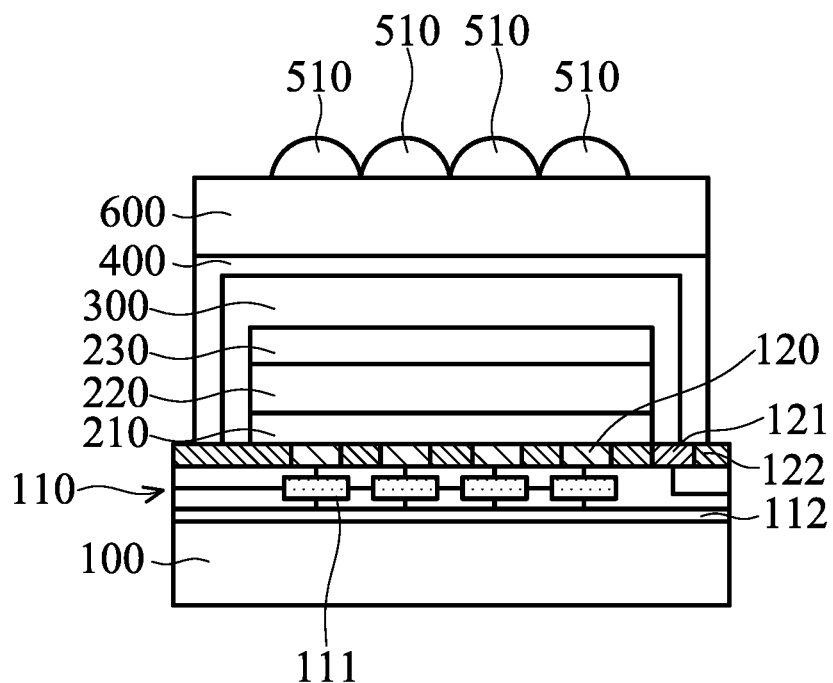

Referring to FIG. 5H, the micro-lens 510 is formed on the filter layer 600 by a deposition process. The deposition process for forming the micro-lens 510 may be spin coating litho-type transparent photoresist and followed by a UV-exposure, a develop and a thermal reflow process, the like, another suitable process, or a combination thereof. Therefore, an image sensor is obtained by the processes mentioned above. However, one or more suitable processes may be performed.

FIGS. 6A-6H are schematic cross-sectional views of an image sensor structure at various stages of fabrication, according to some other embodiments. FIGS. 6A-6H also shows schematic cross-sectional views of the image sensor structure 1 shown in FIG. 1A as an example.

Figure 6A:
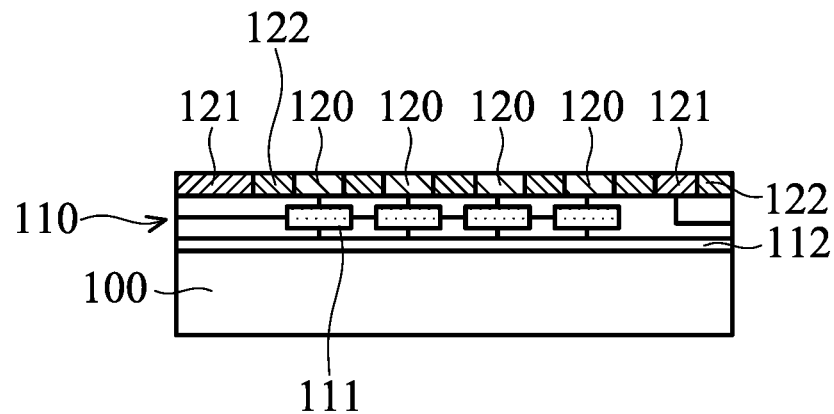
FIGS. 6A-6H are schematic cross-sectional views of an image sensor structure at various stages of fabrication, according to some embodiments of the disclosure.

Referring to FIG. 6A, the structure shown in FIG. 6A is similar with the structure shown in FIG. 5A. Two top contact pads 121 are disposed on the readout circuit array 110. The same description will not be repeated for clarity.

Figure 6B:
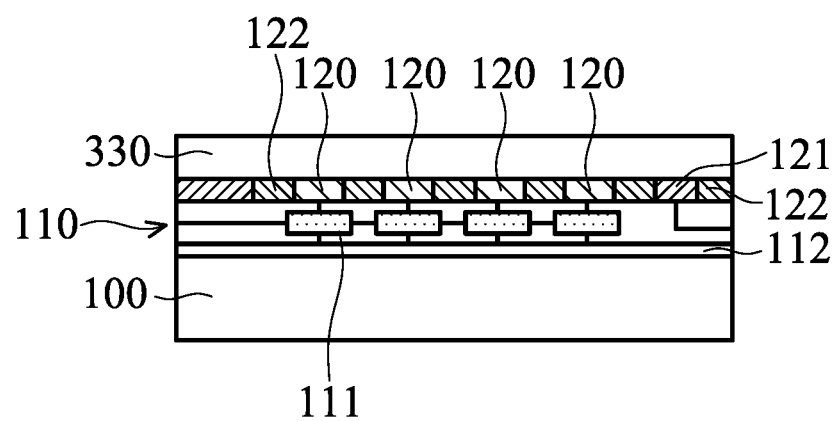

Referring to FIG. 6B, the photoresist material is formed on the bottom contact pads 120 and the top contact pads 121 by a deposition process. The deposition process for forming the photoresist material may be a spin coating followed by a hot back or a UV exposure process, the like, another suitable process, or a combination thereof.

Figure 6C:
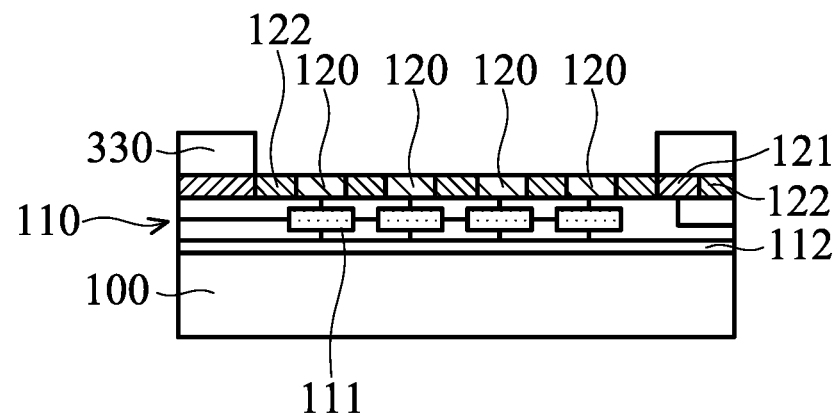

Referring to FIG. 6C, the photoresist material is patterned to form the patterned photoresist layer 330 on the top contact pads 121 and expose a top surface of the bottom contact pads 120. The patterned photoresist layer 330 covers the top contact pads 121 and defines the active area of the image sensor structure.

Figure 6D:
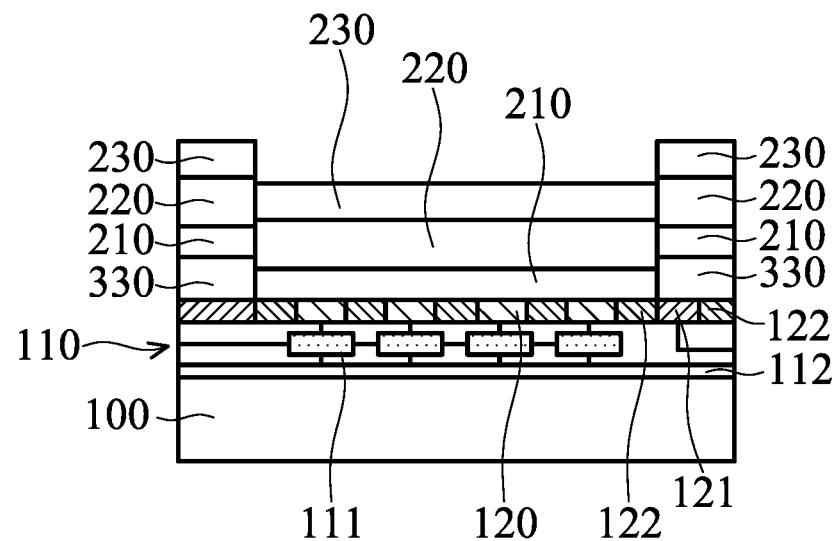

Referring to FIG. 6D, the first carrier transport layer 210, the photoelectric layer 220 and/or the second carrier transport layer 230 are sequentially formed on the top surface of the bottom contact pads 120 by a deposition process, respectively. The first carrier transport layer 210, the photoelectric layer 220 and/or the second carrier transport layer 230 are conformally formed. The deposition process for forming the first carrier transport layer 210, the photoelectric layer 220 and/or the second carrier transport layer 230 may be a spin-coating, a doctor-a blading, a screen printing, the like, another suitable process, or a combination thereof.

Figure 6E:
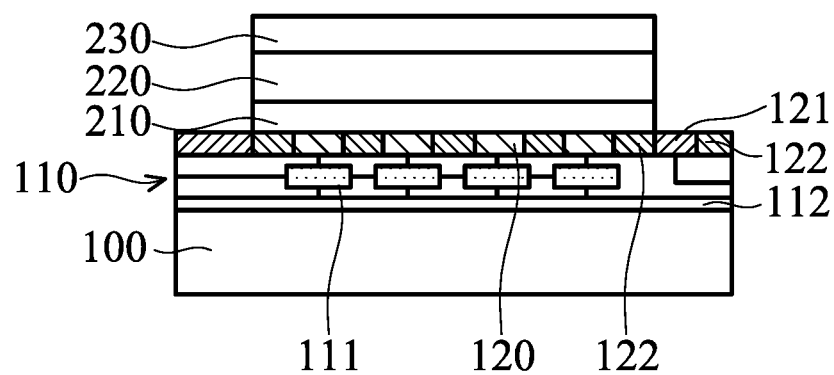

Referring to FIG. 6E, the patterned photoresist layer 330, the second carrier transport layer 230, the photoelectric layer 220 and the first carrier transport layer 210 on the top contact pads 121 are removed by a lift-off process, such as immersing substrate into hot DMSO-based solvent, to expose the top surface of the top contact pads 121. Thus, the second carrier transport layer 230, the photoelectric layer 220 and the first carrier transport layer 210 on the bottom contact pads 120 remain.

Figure 6F:
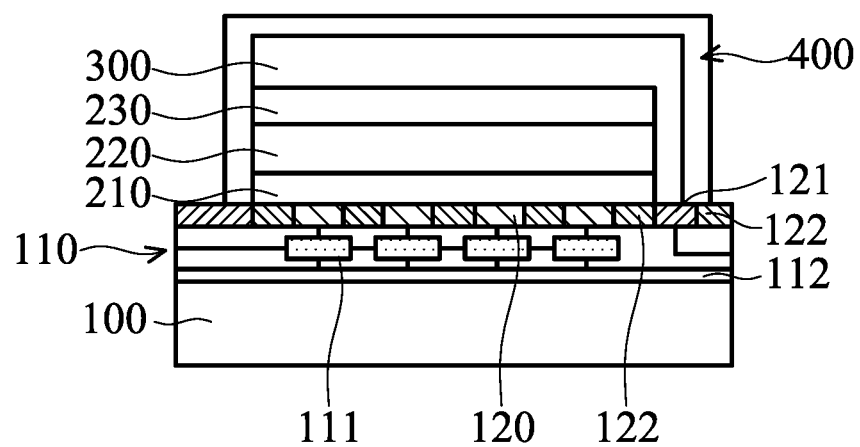
Figure 6G:
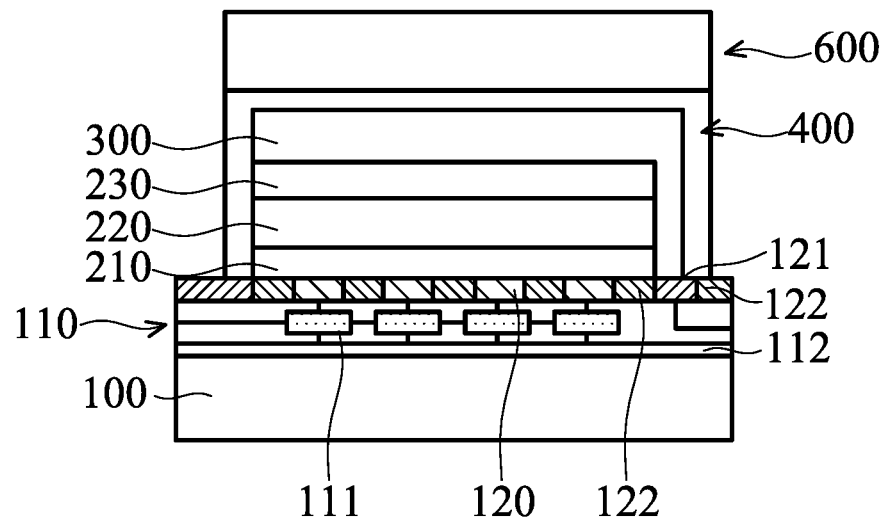
Figure 6H:
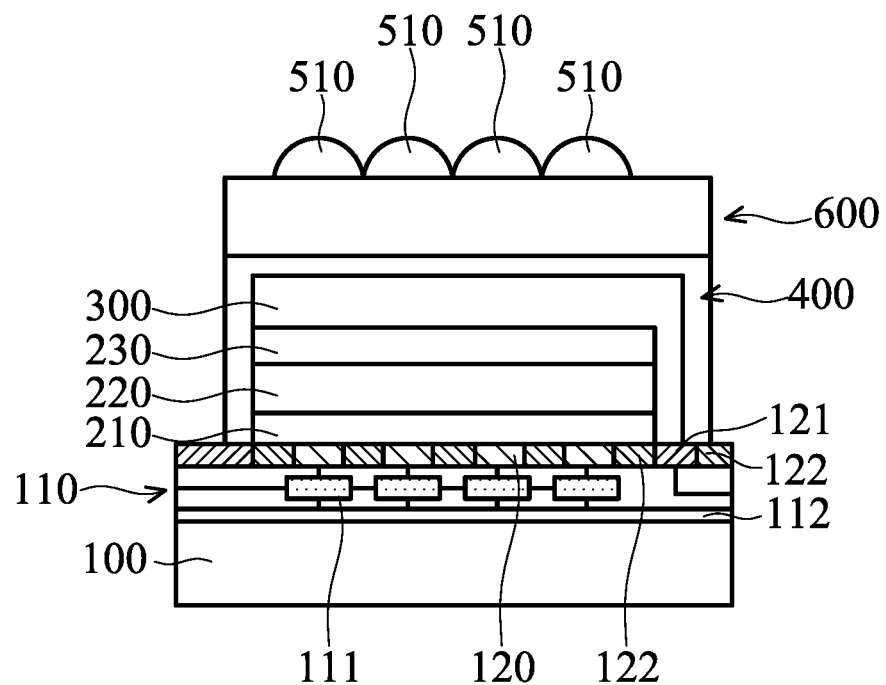

Referring to FIGS. 6F to 6H, the structures shown in FIGS. 6F to 6H are similar with the structures shown in FIGS. 5F to 5H, respectively. The same description will not be repeated. Therefore, an image sensor is obtained by the processes mentioned above.

FIGS. 7A-7F are schematic cross-sectional views of an image sensor structure at various stages of fabrication, according to some other embodiments. FIGS. 7A-7F also shows schematic cross-sectional views of the image sensor structure 1 shown in FIG. 1A as an example.

Figure 7A:
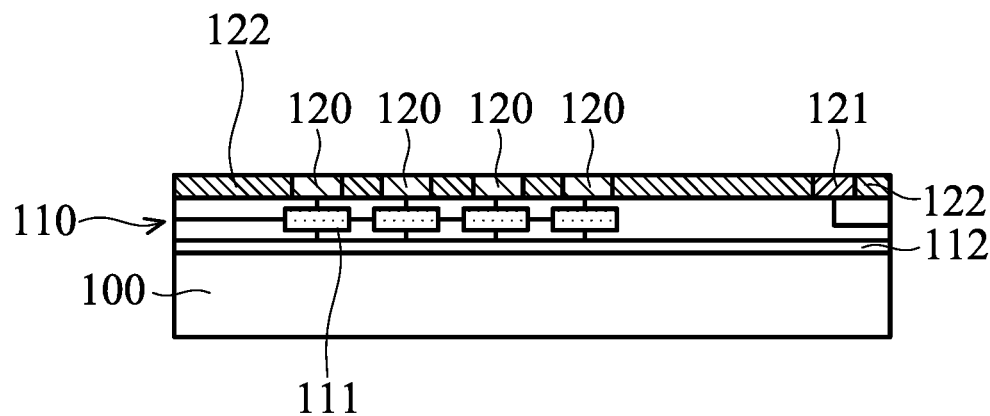
FIGS. 7A-7F are schematic cross-sectional views of an image sensor structure at various stages of fabrication, according to some embodiments of the disclosure.

Referring to FIG. 7A, the structure shown in FIG. 7A is substantially as same as the structure shown in FIG. 5A. The same description will not be repeated for clarity.

Figure 7B:
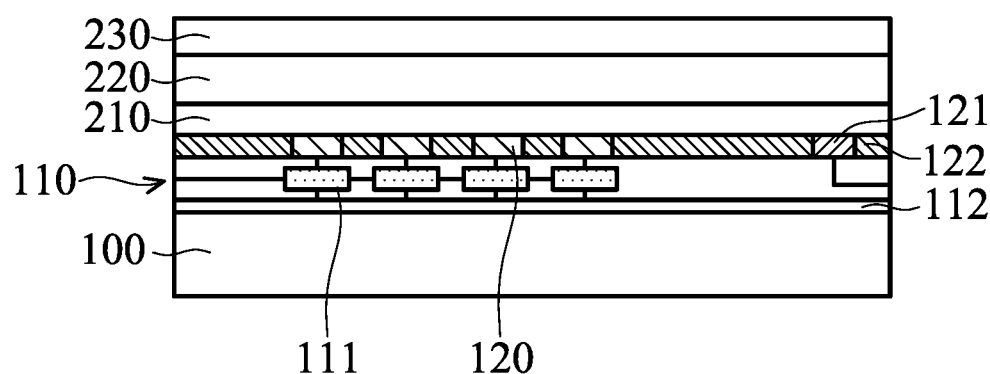

Referring to FIG. 7B, the first carrier transport layer 210, the photoelectric layer 220 and the second carrier transport layer 230 are sequentially formed on the bottom contact pads 121.

Figure 7C:
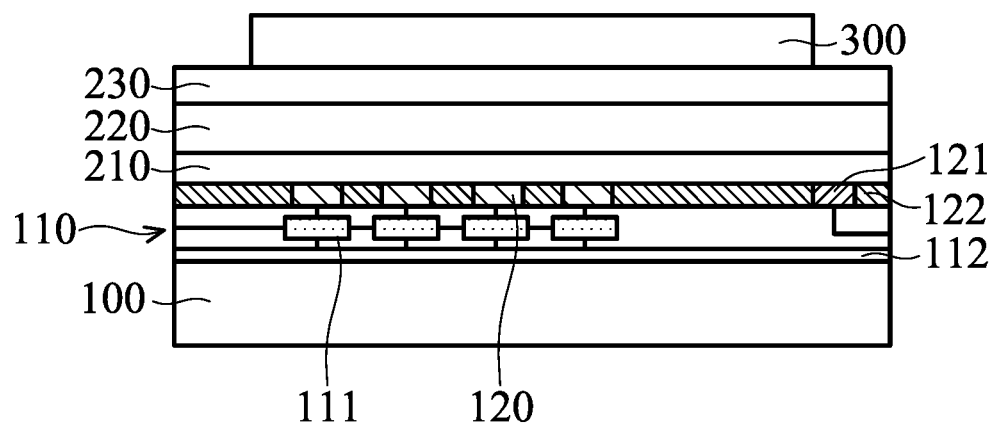

Referring to FIG. 7C, the conductive layer 300 is directly formed on the second carrier transport layer 230 by an evaporation process. The evaporation process is able to selectively deposit material of the conductive layer 300 on the second carrier transport layer 230. The conductive layer 300 corresponds to the bottom contact pads 120 and the isolation materials 122. The conductive layer 300 defines an active area of the image sensor.

Figure 7D:
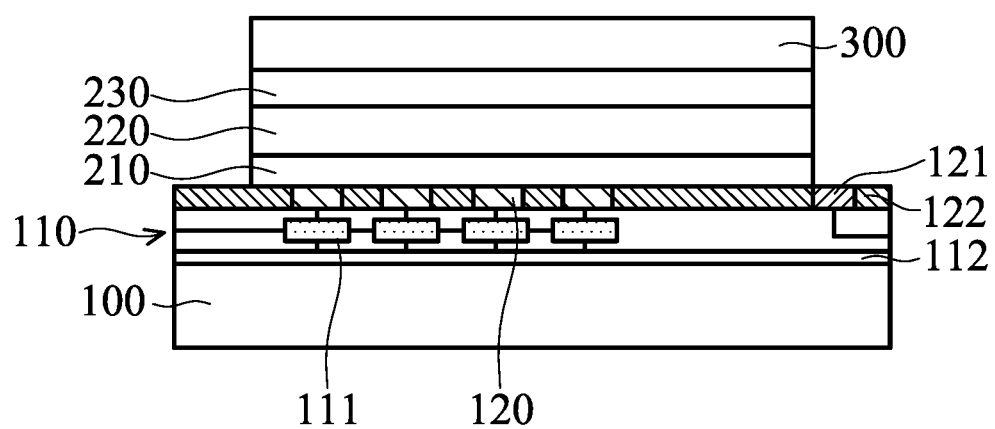

Referring to FIG. 7D, the first carrier transport layer 210, the photoelectric layer 220 and the second carrier transport layer 230 are etched by using the conductive layer 300 as etching mask to expose a top surface of the top contact pad 121. The conductive layer 300 on the second carrier transport layer 230 is used as the etching mask so that there is no need to form an additional mask or photoresist as the etching mask. Thus, the manufacturing method of the image sensor can be simplified.

Figure 7E:
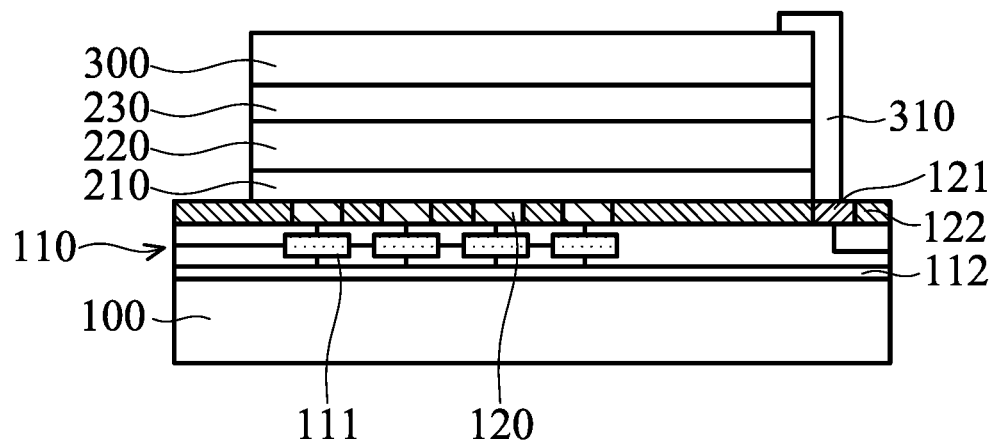

Referring to FIG. 7E, a conductive portion 310 is formed on the top of the conductive layer 300 by a spin-coating, a doctor-blading, a screen printing, or physical vapor deposition (PVD), chemical vapor deposition (CVD), atomic layer deposition (ALD), the like, another suitable process, or a combination thereof. The conductive portion 310 may be any kinds of conductive materials, such as metals, heavy doped semiconductor, and conductive polymer. Since the scale is not drawing as real scale, the total thickness of the first carrier transport layer 210, the photoelectric layer 220, and the second carrier transport layer 230 is less than micrometer. The conductive portion 310 connects the conductive layer 300 to the top contact pad 121.

Figure 7F:
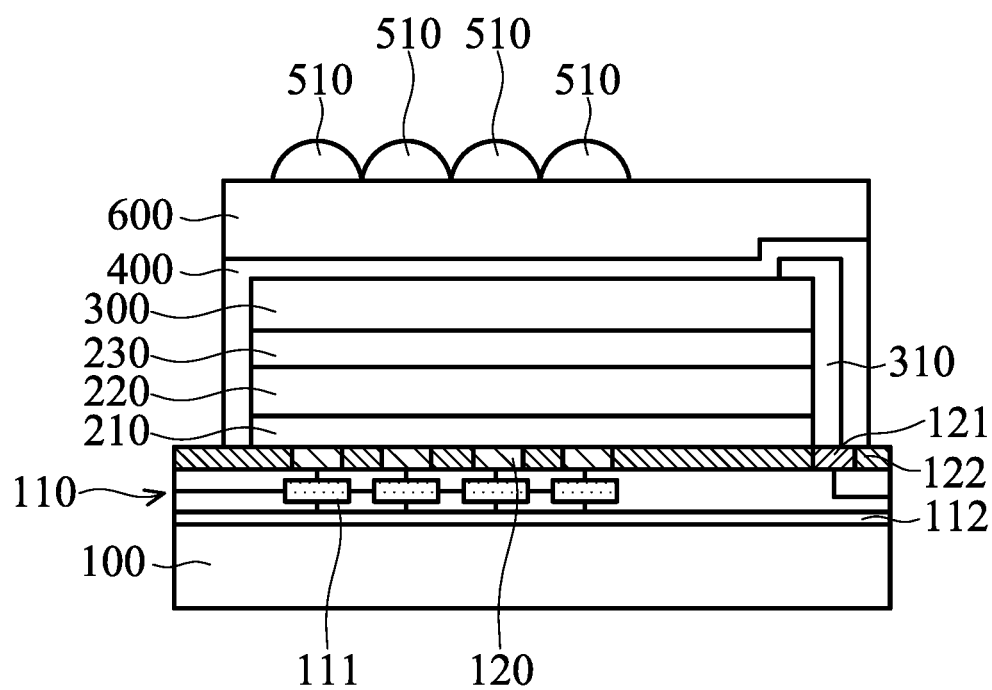

Referring to FIG. 7F, the structure shown in FIG. 7F is similar with the structure shown in FIG. 6H. The same description will not be repeated. Therefore, an image sensor is obtained by the processes mentioned above. As shown in FIG. 7F, the protective layer 400 may be conformally formed on the conductive layer 300 by a deposition process. The filter layer 600 may be formed on the protective layer 400 by a deposition process. Besides, the filter layer 600 may be planarized by a planarization processes.

Figure 8A:
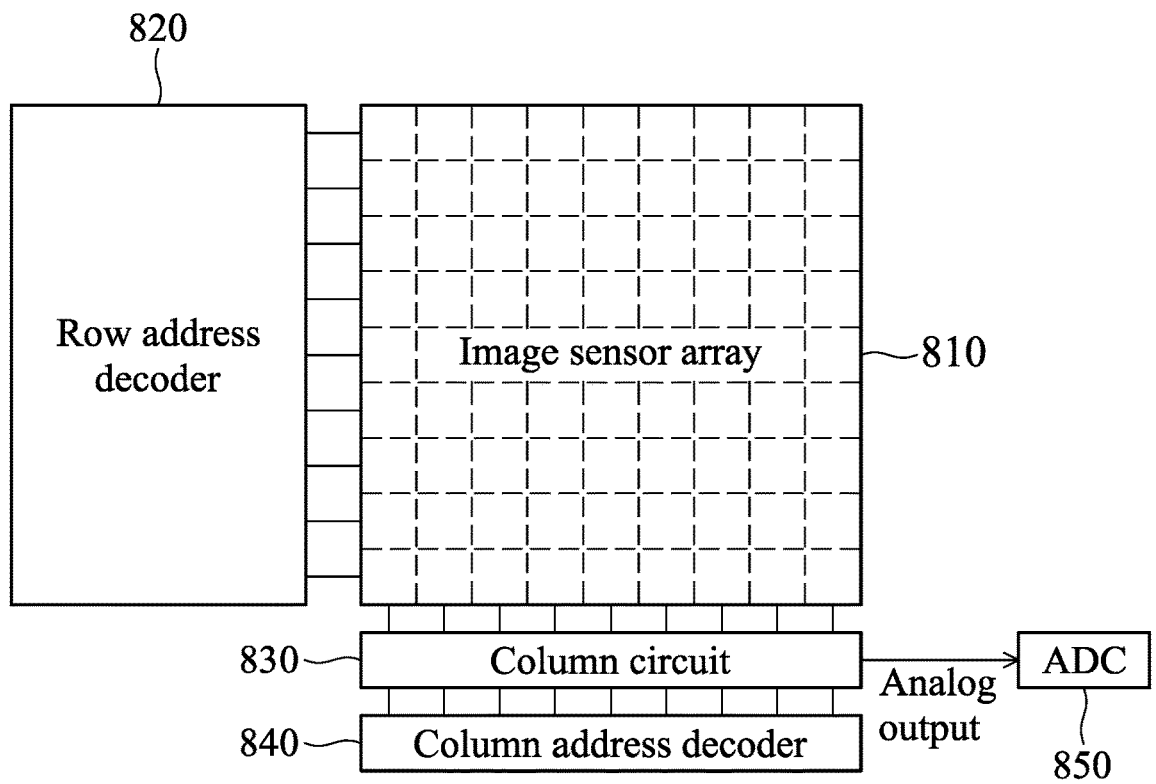
FIG. 8A is a schematic view of an image sensor, according to some embodiments of the disclosure.

FIG. 8A shows the structure of an image sensor, which includes an image sensor array 810, a row address decoder 820, a column address decoder 840, a column circuit 830, and an analog-to-digital converter (ADC) 850. The image sensor array 810 includes the first carrier transport layer, the photoelectric layer, and the second carrier transport layer, the top conductive layer, the filter layer, and the micro-lens.

Figure 8B:
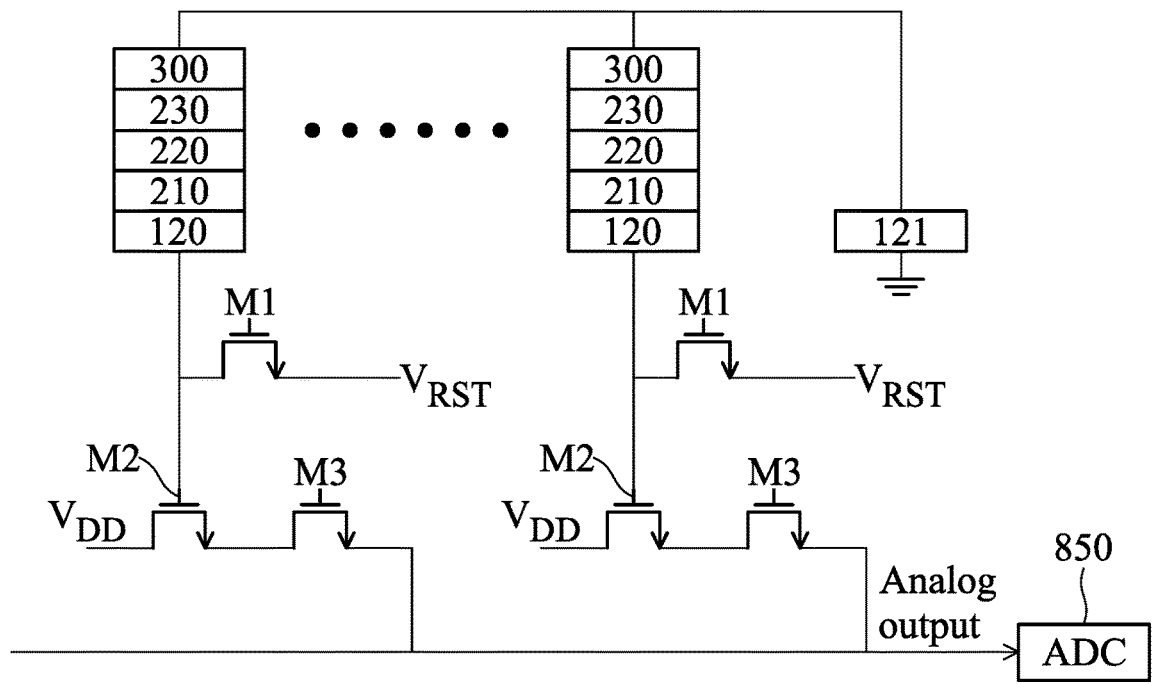
FIG. 8B is a schematic circuit of an image sensor, according to some embodiments of the disclosure.

Referring to FIG. 8B, the circuit of an image sensor array includes bottom contact pads 120, the first carrier transport layer 210, the photoelectric layer 220, the second carrier transport layer 230, and the top conductive layer 300. The top conductive layer 300 is connected to the top contact pad 121. The circuit below the bottom contact pads 120 and the top contact pad 121 is the readout circuit. Each pixel includes a reset switch transistor M1, a source follower transistor M2, and a row select switch transistor M3. The analog readout voltage is further deliver to the ADC 850 for further image processing.

In summary, according to some embodiments, the image sensor structures provide a monolithic IR narrow band image sensor by integrating the read-out circuit array 110, bottom contact pad 120, a first carder transport layer 210, a photoelectric layer 220, a second carder transport layer 230, top conductive layer 300 and filter layer 600. The image sensor structures provide a narrow band sensing when the wavelength of the sensing light is defined by properly selecting sensing array materials and filter layer 600. In addition, these image sensor structures have relatively low angle dependent quantum efficiency peak shift since the filter layer 600 and the photoelectric layer 220 is selected based on the relationship of the normalized extinction coefficient of the filter layer 600 and the photoelectric layer 220. Therefore, the image sensor structures are used for high FOV image sensing application.

The scope of the disclosure is not limited to the manufacturing process, machine, manufacturing, material composition, device, method, structure and step in the specific embodiments described in the specification. A person of ordinary skill in the art will understand current and future manufacturing processes, machine, manufacturing, material composition, device, method, structure and step from the content disclosed in some embodiments, as long as the current or future manufacturing processes, machine, manufacturing, material composition, device, method, structure and step performs substantially the same functions or obtain substantially the same results as the disclosure. Therefore, the scope of the disclosure includes the above-mentioned manufacturing process, machine, manufacturing, material composition, device, method, structure and steps. Moreover, each of the claims constitutes an individual embodiment, and the scope of the disclosure also includes combinations of each of the claims and embodiments.

The foregoing outlines features of several embodiments of the disclosure, so that a person of ordinary skill in the art may better understand the aspects. Although some embodiments of the disclosure and their advantages have been disclosed, a person of ordinary skill in the art should appreciate that, the disclosure may be readily used as a basis for changing, replacing, substituting and/or modifying other processes and structures for carrying out the same purposes and/or achieving the same advantages of the embodiments introduced herein, A person of ordinary skill in the art should also realize that such equivalent constructions do not depart from the spirit and scope of the disclosure, and that they may make various changes, substitutions, and alterations herein without departing from the spirit and scope of the disclosure.

What is claimed is:

1. An image sensor structure, comprising:
    a substrate;
    a readout circuit array located on the substrate;
    a photoelectric layer disposed over the readout circuit array;
    a filter layer is disposed over the photoelectric layer;
    wherein the filter layer has a first spectrum defining a first wavelength, the photoelectric layer has a second spectrum defining a second wavelength longer than the first wavelength, the first spectrum is represented with a log curve of normalized extinction coefficient of the filter layer versus wavelength, and the second spectrum is represented with a log curve of normalized extinction coefficient of the photoelectric layer versus wavelength,
    the first wavelength corresponds to a first line passing through a first point and a second point on a curve of the first spectrum of the filter layer, the first point aligns with the normalized extinction coefficient of 0.9, the second point aligns with the normalized extinction coefficient of 0.1, and the first wavelength is defined by the first line extending to a position of the normalized extinction coefficient of 0;
    the second wavelength corresponds to a second line passing through a third point and a fourth point on a curve of the second spectrum of the photoelectric layer, the third point aligns with the normalized extinction coefficient of 0.9, the fourth point aligns with the normalized extinction coefficient of 0.1, and the second wavelength is defined by the second line extending to a position of the normalized extinction coefficient of 0.

2. The image sensor structure as claimed in claim 1, wherein the second wavelength is longer than the first wavelength by 10 to 150 nm.

3. The image sensor structure as claimed in claim 1, wherein the first point and second point fall within a longest wavelength segment of the first spectrum and the third point and the fourth point fall within a longest wavelength segment of the second spectrum.

4. The image sensor structure as claimed in claim 1, wherein the extinction coefficient is normalized by a maximum extinction coefficient of a peak of the first spectrum or the second spectrum.

5. The image sensor structure as claimed in claim 1, further comprising a bottom contact pad on the readout circuit array and a conductive layer on the photoelectric layer.

6. The image sensor structure as claimed in claim 5, further comprising:
    a first carrier transport layer disposed between the bottom contact pad and the photoelectric layer; and
    a second carrier transport layer disposed between the photoelectric layer and the conductive layer;
    wherein the first carrier transport layer or the second carrier transport layer is an electron transport layer or a hole transport layer.

7. The image sensor structure as claimed in claim 1, further comprising:
    a protective layer disposed between the photoelectric layer and the filter layer; and
    a micro-lens disposed between the protective layer and the filter layer.

8. The image sensor as claimed in claim 1, further comprising:
    a protective layer disposed between the photoelectric layer and the filter layer; and
    a micro-lens disposed on the filter layer.

9. The image sensor structure as claimed in claim 1, further comprising:
    a protective layer disposed on the filter layer; and
    a micro-lens disposed on the protective layer.

10. The image sensor structure as claimed in claim 1, wherein the filter layer is an absorptive filter layer.

11. A method of manufacturing an image sensor structure, comprising:
    forming a substrate;
    forming a readout circuit array on the substrate;
    forming a photoelectric layer on the readout circuit array;
    forming a filter layer over the photoelectric layer
    wherein the filter layer has a first spectrum defining a first wavelength, the photoelectric layer has a second spectrum defining a second wavelength longer than the first wavelength, the first spectrum is represented with a log curve of normalized extinction coefficient of the filter layer versus wavelength, and the second spectrum is represented with a log curve of normalized extinction coefficient of the photoelectric layer versus wavelength,
    the first wavelength corresponds to a first line passing through a first point and a second point on a curve of the first spectrum of the filter layer, the first point aligns with the normalized extinction coefficient of 0.9, the second point aligns with the normalized extinction coefficient of 0.1, and the first wavelength is defined by the first line extending to a position of the normalized extinction coefficient of 0;
    the second wavelength corresponds to a second line passing through a third point and a fourth point on a curve of the second spectrum of the photoelectric layer, the third point aligns with the normalized extinction coefficient of 0.9, the fourth point aligns with the normalized extinction coefficient of 0.1, and the second wavelength is defined by the second line extending to a position of the normalized extinction coefficient of 0.

12. The method as claimed in claim 11, wherein the second wavelength is longer than the first wavelength by 10 to 150 nm.

13. The method as claimed in claim 11, further comprising:
    forming a bottom contact pad on the readout circuit array;
    forming a first carrier transport layer between the bottom contact pad and the photoelectric layer; and
    forming a conductive layer on the photoelectric layer;
    forming a second carrier transport layer between the photoelectric layer and the conductive layer;
    wherein the first carrier transport layer is electron transport layer or hole transport layer and the second carrier transport layer is electron transport layer or hole transport layer.

14. The method as claimed in claim 11, further comprising:
    forming a protective layer between the photoelectric layer and the filter layer; and
    forming micro-lens between the protective layer and the filter layer.

15. The method as claimed in claim 11, further comprising:
    forming a protective layer between the photoelectric layer and the filter layer; and
    forming micro-lens on the filter layer.

16. The method as claimed in claim 11, further comprising:
    forming a protective layer on the filter layer; and
    forming micro-lens on the protective layer.

17. The method as claimed in claim 11, wherein the filter layer is an absorptive filter layer.

18. The method as claimed in claim 11, wherein forming the photoelectric layer on the readout circuit array further comprises:
    forming a photoelectric material on the readout circuit array;
    forming a patterned photoresist layer on the photoelectric material;
    etching the photoelectric material; and
    removing the patterned photoresist layer to form the photoelectric layer, wherein the photoelectric layer and the patterned photoresist layer are made of different materials.

* * * * *